US011299503B2

(12) United States Patent
Kim et al.

(10) Patent No.: US 11,299,503 B2
(45) Date of Patent: Apr. 12, 2022

(54) COMPOUND, COATING COMPOSITION COMPRISING THE SAME, ORGANIC LIGHT EMITTING DEVICE USING THE SAME AND METHOD FOR MANUFACTURING THE SAME

(71) Applicant: LG Chem, Ltd., Seoul (KR)

(72) Inventors: Young Kwang Kim, Daejeon (KR); Jaesoon Bae, Daejeon (KR); Jaechol Lee, Daejeon (KR); Yongwook Kim, Daejeon (KR); Hwakyung Kim, Daejeon (KR); Daeho Kim, Daejeon (KR)

(73) Assignee: LG Chem, Ltd.

( * ) Notice: Subject to any disclaimer, the term of this patent is extended or adjusted under 35 U.S.C. 154(b) by 106 days.

(21) Appl. No.: 16/494,908

(22) PCT Filed: Jan. 24, 2019

(86) PCT No.: PCT/KR2019/001013
§ 371 (c)(1),
(2) Date: Sep. 17, 2019

(87) PCT Pub. No.: WO2019/156397
PCT Pub. Date: Aug. 15, 2019

(65) Prior Publication Data
US 2020/0270279 A1    Aug. 27, 2020

(30) Foreign Application Priority Data
Feb. 8, 2018   (KR) .................. 10-2018-0015630

(51) Int. Cl.
*C07F 7/08* (2006.01)
*H01L 51/00* (2006.01)
(Continued)

(52) U.S. Cl.
CPC ............. *C07F 7/081* (2013.01); *C09K 11/06* (2013.01); *H01L 51/0005* (2013.01);
(Continued)

(58) Field of Classification Search
CPC .... C07F 7/081; H01L 51/006; H01L 51/0054; H01L 51/0094; H01L 51/5012; C09K 11/06; C09D 7/63
See application file for complete search history.

(56) References Cited

U.S. PATENT DOCUMENTS 9,978,948 B2 * 5/2018 Funahashi .............. C09D 11/38
2004/0067387 A1   4/2004 Kim et al.
(Continued)

FOREIGN PATENT DOCUMENTS

JP        2014082479 A    5/2014
KR       20040028954 A    4/2004
(Continued)

OTHER PUBLICATIONS

International Search Report for PCT/KR2019/001013 dated Apr. 26, 2019.

*Primary Examiner* — Aaron J Gray
(74) *Attorney, Agent, or Firm* — Lerner, David, Littenberg, Krumholz & Mentlik, LLP

(57) ABSTRACT

The present specification relates to a compound represented by Chemical Formula 1, a coating composition comprising the compound, an organic light emitting device formed using the coating composition, and a method for manufacturing the same.

10 Claims, 1 Drawing Sheet

(51) Int. Cl.
*H01L 51/50* (2006.01)
*C09K 11/06* (2006.01)

(52) U.S. Cl.
CPC ........ *H01L 51/006* (2013.01); *H01L 51/0054* (2013.01); *H01L 51/0094* (2013.01); *H01L 51/5012* (2013.01)

(56) References Cited

U.S. PATENT DOCUMENTS

| | | | | |
|---|---|---|---|---|
| 2009/0134781 | A1* | 5/2009 | Jang | C07C 211/54 313/504 |
| 2011/0006289 | A1* | 1/2011 | Mizuki | C09B 57/001 257/40 |
| 2012/0153270 | A1* | 6/2012 | Horiuchi | C07D 471/04 257/40 |
| 2015/0034915 | A1 | 2/2015 | Kim et al. | |
| 2015/0041775 | A1 | 2/2015 | Jeong et al. | |
| 2015/0270502 | A1 | 9/2015 | Fuchiwaki et al. | |
| 2016/0099418 | A1 | 4/2016 | Nakano et al. | |
| 2018/0019430 | A1 | 1/2018 | Cha et al. | |

FOREIGN PATENT DOCUMENTS

| | | |
|---|---|---|
| KR | 20080071969 A | 8/2008 |
| KR | 20110068239 A | 6/2011 |
| KR | 20150014778 A | 2/2015 |
| KR | 20150018230 A | 2/2015 |
| KR | 20150090021 A | 8/2015 |
| KR | 20160041744 A | 4/2016 |
| KR | 20170043987 A | 4/2017 |
| KR | 20180007906 A | 1/2018 |

* cited by examiner

| 701 |
|---|
| 601 |
| 501 |
| 401 |
| 301 |
| 201 |
| 101 |

COMPOUND, COATING COMPOSITION COMPRISING THE SAME, ORGANIC LIGHT EMITTING DEVICE USING THE SAME AND METHOD FOR MANUFACTURING THE SAME

CROSS-REFERENCE TO RELATED APPLICATIONS

The present application is a national phase entry under U.S.C. § 317 of International Application No. PCT/KR2019/001013 filed Jan. 24, 2019, which claims priority from Korean Patent Application No. 10-2018-0015630, filed Feb. 8, 2018, all of which are incorporated herein by reference.

TECHNICAL FIELD

The present specification relates to a compound, a coating composition comprising the compound, an organic light emitting device formed using the coating composition, and a method for manufacturing the same.

BACKGROUND ART

An organic light emission phenomenon is one of examples converting a current to visible light by an internal process of specific organic molecules. A principle of an organic light emission phenomenon is as follows. When an organic material layer is placed between an anode and a cathode and a current is applied between the two electrodes, electrons and holes are injected to the organic material layer from the cathode and the anode, respectively. The holes and the electrons injected to the organic material layer recombine to form excitons, and light emits when these excitons fall back to the ground state. An organic light emitting device using such a principle may be generally formed with a cathode, an anode, and an organic material layer placed therebetween, for example, an organic material layer comprising a hole injection layer, a hole transfer layer, a light emitting layer, an electron transfer layer and an electron injection layer.

A deposition process has been normally used in the art for manufacturing an organic light emitting device. However, manufacturing an organic light emitting device using a deposition process has a problem of high material loss, and in order to resolve such a problem, technologies for manufacturing a device through a solution process capable of increasing production efficiency with low material loss have been developed, and development of materials usable in the solution process has been required.

Materials used in an organic light emitting device for a solution process need to have properties as follows.

First, a storable homogeneous solution needs to be formed. Commercialized materials for a deposition process have favorable crystallinity, and are not well-dissolved in a solution, or crystals are readily caught even when forming a solution. Therefore, a concentration gradient of the solution may change depending on the storage time or possibility of forming a defective device is high.

Second, materials used in the solution process need to have excellent coatability when forming a thin film so that a thin film with a uniform thickness is formed without causing holes or aggregation, and excellent current efficiency and excellent lifetime properties are required when manufacturing an organic light emitting device.

PRIOR ART DOCUMENTS

Patent Documents

Korean Patent Application Laid-Open Publication No. 10-2004-0028954

DISCLOSURE

Technical Problem

The present specification is directed to providing a compound, a coating composition comprising the compound, an organic light emitting device formed using the coating composition, and a method for manufacturing the same.

Technical Solution

One embodiment of the present specification provides a compound represented by the following Chemical Formula 1.

[Chemical Formula 1]

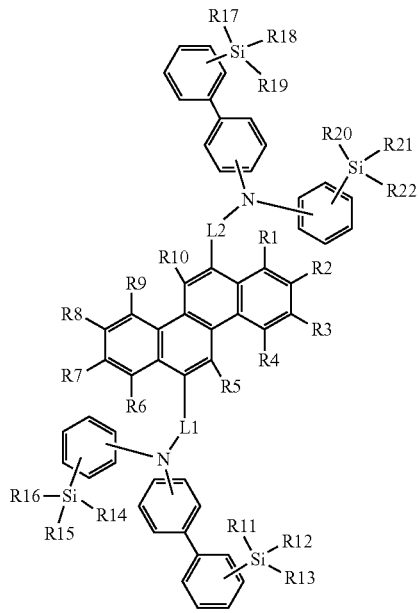

In Chemical Formula 1,

L1 and L2 are the same as or different from each other, and each independently a direct bond; a substituted or unsubstituted arylene group; or a substituted or unsubstituted heteroarylene group, R1 to R10 are the same as or different from each other, and each independently hydrogen; deuterium; a halogen group; a hydroxyl group; a nitrile group; a substituted or unsubstituted alkyl group; a substituted or unsubstituted cycloalkyl group; a substituted or unsubstituted silyl group; a substituted or unsubstituted aryl group; or a substituted or unsubstituted heterocyclic group, and R11 to R22 are the same as or different from each other, and each independently a substituted or unsubstituted alkyl group having 6 to 30 carbon atoms; or a substituted or unsubstituted aryl group.

Another embodiment of the present specification provides a coating composition comprising the compound.

Another embodiment of the present specification provides an organic light emitting device comprising a first electrode; a second electrode provided opposite to the first electrode; and one or more organic material layers provided between the first electrode and the second electrode, wherein one or more layers of the organic material layers comprise the coating composition.

Another embodiment of the present specification provides a method for manufacturing an organic light emitting device comprising preparing a substrate; forming a first electrode on the substrate; forming one or more organic material layers on the first electrode; and forming a second electrode on the organic material layer, wherein the forming of organic material layers comprises forming one or more organic material layers using the coating composition.

Advantageous Effects

A compound according to one embodiment of the present disclosure can be prepared using a solution process, and therefore, large area devices can be manufactured, and the compound can be used as a material of an organic material layer of an organic light emitting device.

In addition, a compound according to one embodiment of the present specification can be used as a material of an organic material layer of an organic light emitting device, and is capable of lowering a driving voltage of the organic light emitting device.

In addition, a compound according to one embodiment of the present specification can be used as a material of an organic material layer of an organic light emitting device, and is capable of enhancing light efficiency.

In addition, a compound according to one embodiment of the present specification can be used as a material of an organic material layer of an organic light emitting device, and is capable of enhancing lifetime properties of the device by thermal stability of the compound.

In addition, a compound according to one embodiment of the present specification can be used as a material of an organic material layer of an organic light emitting device, and is capable of enhancing solubility.

DESCRIPTION OF DRAWINGS

The FIGURE illustrates an example of an organic light emitting device according to one embodiment of the present specification.

MODE FOR DISCLOSURE

Hereinafter, the present specification will be described in more detail.

One embodiment of the present specification provides a compound represented by the following Chemical Formula 1.

Chrysene is very effective as a high-intensity luminous body when used in an organic light emitting device, but has a disadvantage of poor solubility. By comprising a silyl group in a chrysene core structure, the compound represented by Chemical Formula 1 of the present specification may mitigate aggregation between molecules by effectively suppressing n-n bonds in the chrysene core structure. Accordingly, there is an advantage in that solubility of the chrysene derivative is sufficiently secured.

In the present specification, "solubility" means a property of a solute being dissolved with respect to a specific solvent, and may be expressed as the number of g of the solute soluble in 100 g of a solvent at a constant temperature.

In the present specification, a description of a certain member being placed "on" another member includes not only a case of the one member adjoining the another member but a case of still another member being present between the two members.

In the present specification, a description of a certain part "comprising" certain constituents means capable of further comprising other constituents, and does not exclude other constituents unless particularly stated on the contrary.

Examples of substituents in the present specification are described below, however, the substituents are not limited thereto.

In the present specification,

means a linked site.

The term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

The term "substituted or unsubstituted" in the present specification means being substituted with one, two or more substituents selected from the group consisting of deuterium; a halogen group; a nitrile group; a hydroxyl group; an alkyl group; a cycloalkyl group; a silyl group; an aryl group; and a heterocyclic group including one or more of N, O, S, Se and Si atoms, or being substituted with a substituent linking two or more substituents among the substituents illustrated above, or having no substituents.

In one embodiment of the present specification, the "substituted or unsubstituted" means being substituted with one, two or more substituents selected from among deuterium; a halogen group; a nitrile group; a hydroxyl group; an alkyl group having 1 to 20 carbon atoms; a cycloalkyl group having 3 to 30 carbon atoms; a silyl group having 1 to 50 carbon atoms; an aryl group having 6 to 30 carbon atoms; and a heterocyclic group having 2 to 30 carbon atoms, or having no substituents.

In one embodiment of the present specification, the "substituted or unsubstituted" means being substituted with one, two or more substituents selected from among deuterium; a halogen group; a nitrile group; a hydroxyl group; an alkyl group having 1 to 10 carbon atoms; a cycloalkyl group having 3 to 20 carbon atoms; a silyl group having 1 to 40 carbon atoms; an aryl group having 6 to 20 carbon atoms; a heterocyclic group having 2 to 20 carbon atoms, or having no substituents.

In the present specification, examples of the halogen group may include fluorine, chlorine, bromine or iodine.

In the present specification, the alkyl group may be linear or branched, and although not particularly limited thereto, the number of carbon atoms may be preferably from 1 to 30; 1 to 20; 1 to 10; or 1 to 5. Specific examples thereof may include methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 4-methylhexyl, 5-methylhexyl and the like, but are not limited thereto.

In the present specification, the cycloalkyl group is not particularly limited, but preferably has 3 to 60 carbon atoms, and more preferably has 3 to 30 carbon atoms. Specific examples thereof may include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl and the like, but are not limited thereto.

In the present specification, the silyl group is a substituent including Si and having the Si atom directly linked as a radical, and is represented by $-SiR_{201}R_{202}R_{203}$. $R_{201}$ to $R_{203}$ are the same as or different from each other, and may be each independently a substituent formed with at least one of hydrogen; deuterium; a halogen group; an alkyl group; an alkenyl group; an alkoxy group; a cycloalkyl group; an aryl group; and a heterocyclic group. Specific examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the aryl group may be a monocyclic aryl group or a polycyclic aryl group.

When the aryl group is a monocyclic aryl group in the present specification, the number of carbon atoms is not particularly limited, but is preferably from 6 to 50, and more preferably from 6 to 30. Specific examples of the monocyclic aryl group may include a phenyl group, a biphenyl group, a terphenyl group, a quaterphenyl group and the like, but are not limited thereto.

When the aryl group is a polycyclic aryl group in the present specification, the number of carbon atoms is not particularly limited, but is preferably from 10 to 50, and more preferably from 10 to 30. Specific examples of the polycyclic aryl group may include a naphthyl group, an anthracenyl group, a phenanthryl group, a pyrenyl group, a perylenyl group, a chrysenyl group, a fluorenyl group and the like, but are not limited thereto.

In the present specification, the heterocyclic group is a group including one or more of N, O, S, Si and Se as a heteroatom, and although not particularly limited thereto, the number of carbon atoms is preferably from 2 to 60, and more preferably from 2 to 30. Examples of the heterocyclic group may include a thiophene group, a furan group, a pyrrole group, an imidazole group, a triazole group, an oxazole group, an oxadiazole group, a triazole group, a pyridyl group, a bipyridyl group, a pyrimidyl group, a triazine group, an acridine group, a pyridazine group, a pyrazine group, a quinolinyl group, a quinazoline group, a quinoxalinyl group, a phthalazinyl group, a pyridopyrimidine group, a pyridopyrazine group, a pyrazinopyrazine group, an isoquinoiline group, an indole group, a carbazole group, a benzoxazole group, a benzimidazole group, a benzothiazole group, a benzocarbazole group, a benzothiophene group, a dibenzothiophene group, a benzofuran group, a phenanthroline group, a pteridine group, a thiazolyl group, an isoxazolyl group, an oxadiazolyl group, a thiadiazolyl group, a dibenzofuran group and the like, but are not limited thereto.

In the present specification, the heteroaryl group may be selected from among the examples of the heterocyclic group except for those that are aromatic, but are not limited thereto.

In the present specification, the arylene group means an aryl group having two bonding sites, that is, a divalent group. Descriptions on the aryl group provided above may apply to the arylene group except for those that are each a divalent group.

In the present specification, the heteroarylene group means a heteroaryl group having two bonding sites, that is, a divalent group. Descriptions on the heteroaryl group provided above may apply to the heteroarylene group except for those that are each a divalent group.

In one embodiment of the present specification, L1 and L2 are the same as or different from each other, and each independently a direct bond, a substituted or unsubstituted arylene group, or a substituted or unsubstituted heteroarylene group.

In one embodiment of the present specification, L1 and L2 are each a direct bond.

In one embodiment of the present specification, L1 and L2 are the same as or different from each other, and each independently a substituted or unsubstituted arylene group having 6 to 30 carbon atoms.

In one embodiment of the present specification, L1 and L2 are the same as or different from each other, and each independently a substituted or unsubstituted phenylene group, a substituted or unsubstituted biphenylene group, or a substituted or unsubstituted naphthylene group.

In one embodiment of the present specification, L1 and L2 are each a phenylene group.

In one embodiment of the present specification, R1 to R10 are the same as or different from each other, and each independently hydrogen; deuterium; a halogen group; a hydroxyl group; a nitrile group; a substituted or unsubstituted alkyl group; a substituted or unsubstituted cycloalkyl group; a substituted or unsubstituted silyl group; a substituted or unsubstituted aryl group; or a substituted or unsubstituted heterocyclic group.

In one embodiment of the present specification, R1 to R10 are the same as or different from each other, and each independently hydrogen; deuterium; a halogen group; a hydroxyl group; a nitrile group; a substituted or unsubstituted alkyl group having 1 to 10 carbon atoms; a substituted or unsubstituted cycloalkyl group having 3 to 30 carbon atoms; a substituted or unsubstituted silyl group having 1 to 50 carbon atoms; a substituted or unsubstituted aryl group having 6 to 30 carbon atoms; or a substituted or unsubstituted heterocyclic group having 2 to 30 carbon atoms.

In one embodiment of the present specification, R1 to R10 are each hydrogen.

In one embodiment of the present specification, R11 to R22 are the same as or different from each other, and each independently a substituted or unsubstituted alkyl group having 6 to 30 carbon atoms; or a substituted or unsubstituted aryl group.

In one embodiment of the present specification, R11 to R22 are the same as or different from each other, and each independently a substituted or unsubstituted aryl group having 6 to 30 carbon atoms.

In one embodiment of the present specification, R11 to R22 are the same as or different from each other, and each independently a substituted or unsubstituted phenyl group, a substituted or unsubstituted biphenyl group, a substituted or unsubstituted terphenyl group, or a substituted or unsubstituted naphthyl group.

In one embodiment of the present specification, R11 to R22 are the same as or different from each other, and each independently a phenyl group unsubstituted or substituted with an alkyl group.

In one embodiment of the present specification, R11 to R22 are the same as or different from each other, and each independently a phenyl group unsubstituted or substituted with a methyl group, an ethyl group, a propyl group, an isopropyl group or a tert-butyl group.

In one embodiment of the present specification, R11 to R22 are each a phenyl group substituted with an isopropyl group.

In one embodiment of the present specification, R11 to R22 are each a phenyl group.

In one embodiment of the present specification, the phenylene group

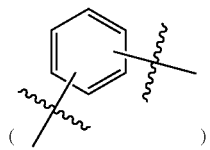

linked to the nitrogen atom of Chemical Formula 1 is any one selected from among the following structures.

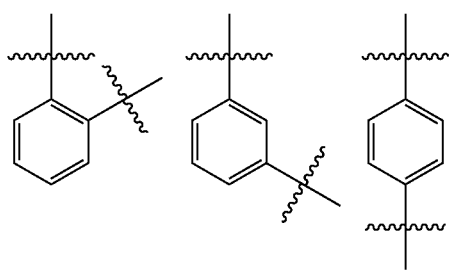 [SMILES: *c1ccccc1* ; *c1cccc(*)c1 ; *c1ccc(*)cc1]

The structures may be substituted with one, two or more substituents selected from the group consisting of deuterium; a halogen group; a nitrile group; a hydroxyl group; an alkyl group; a cycloalkyl group; a silyl group; an aryl group; and a heterocyclic group.

In one embodiment of the present specification, the biphenylene group

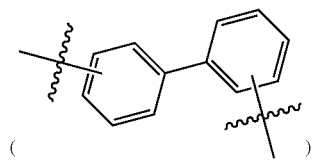

linked to the nitrogen atom of Chemical Formula 1 is any one selected from among the following structures.

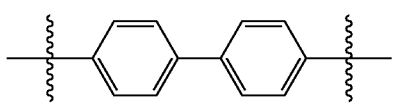

-continued

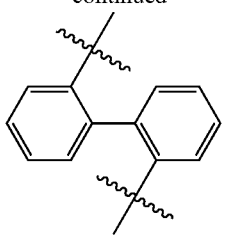

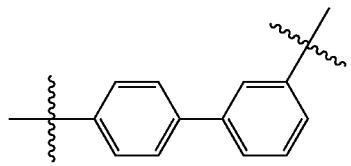

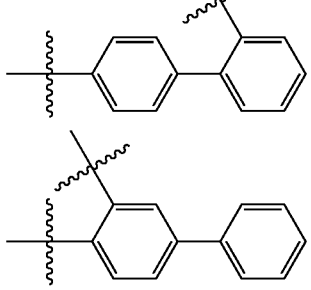

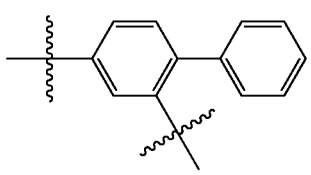

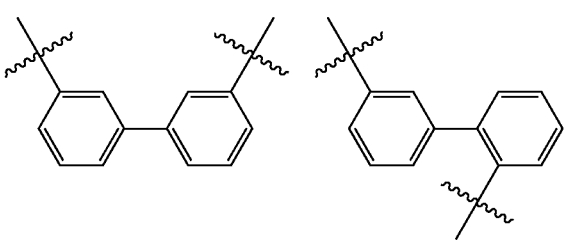

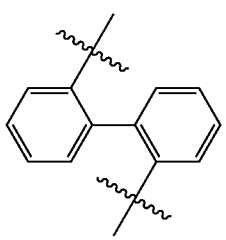

The structures may be substituted with one, two or more substituents selected from the group consisting of deuterium; a halogen group; a nitrile group; a hydroxyl group; an alkyl group; a cycloalkyl group; a silyl group; an aryl group; and a heterocyclic group.

In one embodiment of the present specification,
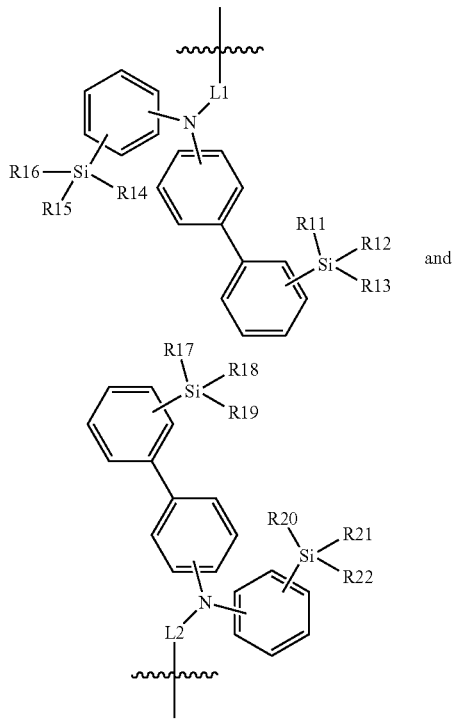
and
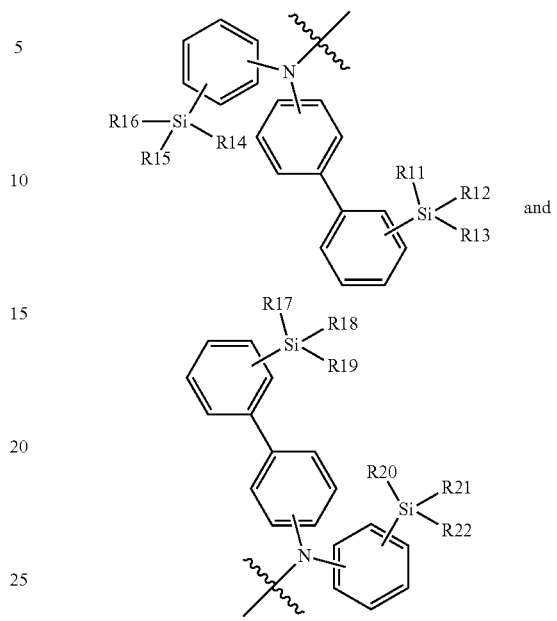
of Chemical Formula 1 are the same as or different from each other.
In one embodiment of the present specification, the compound represented by Chemical Formula 1 is any one selected from among the following compounds.
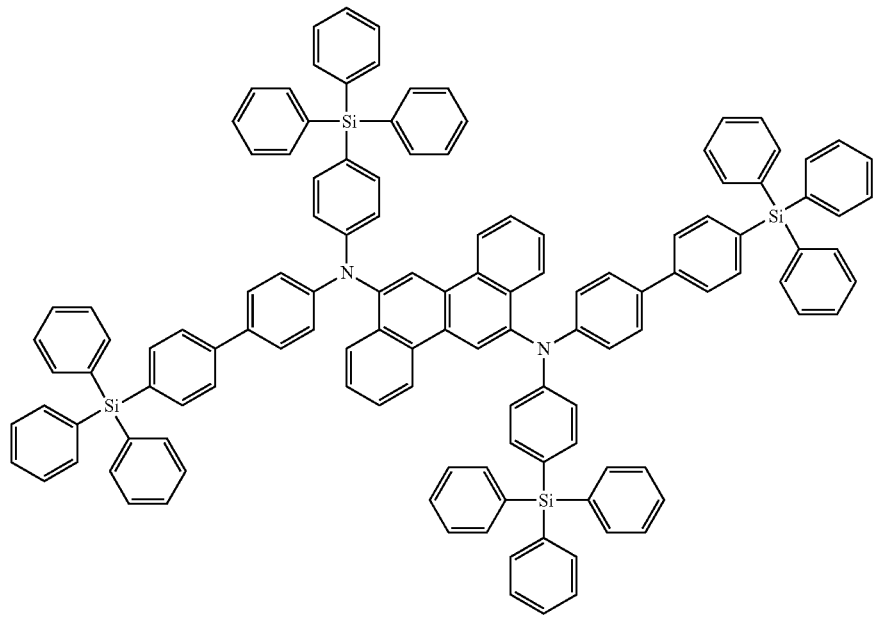
BD1

-continued
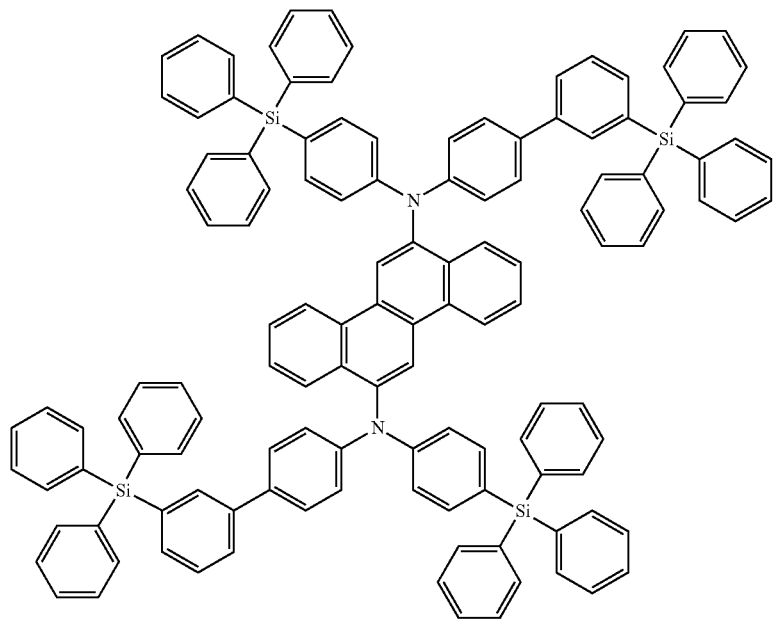
BD2
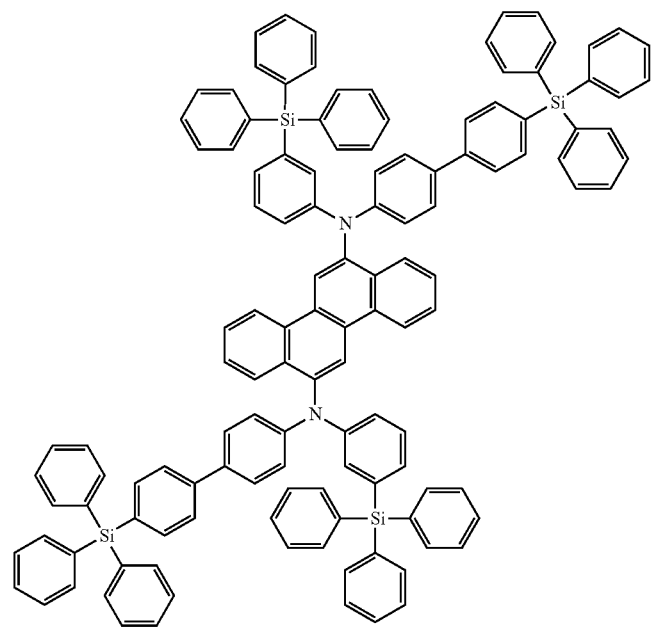
BD3

-continued
BD4
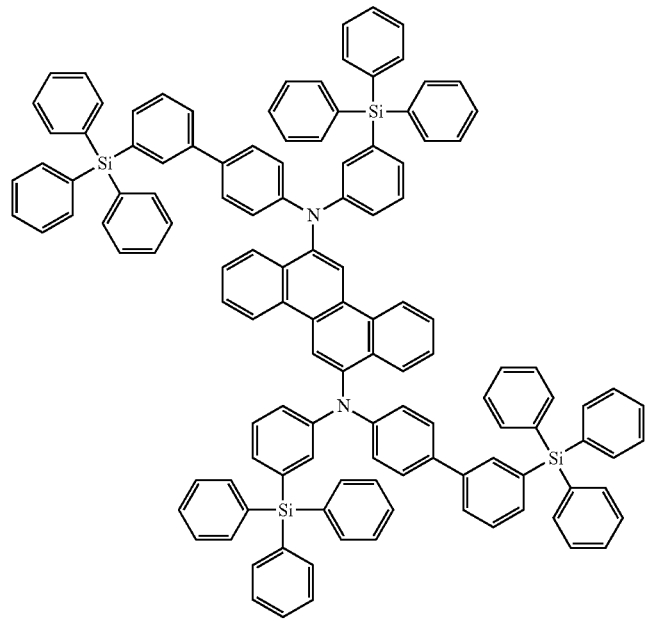
BD5
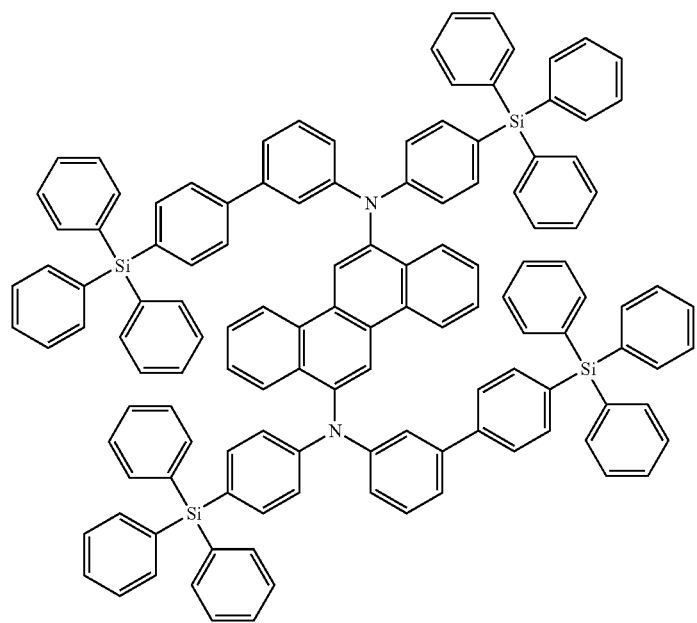

-continued
BD6
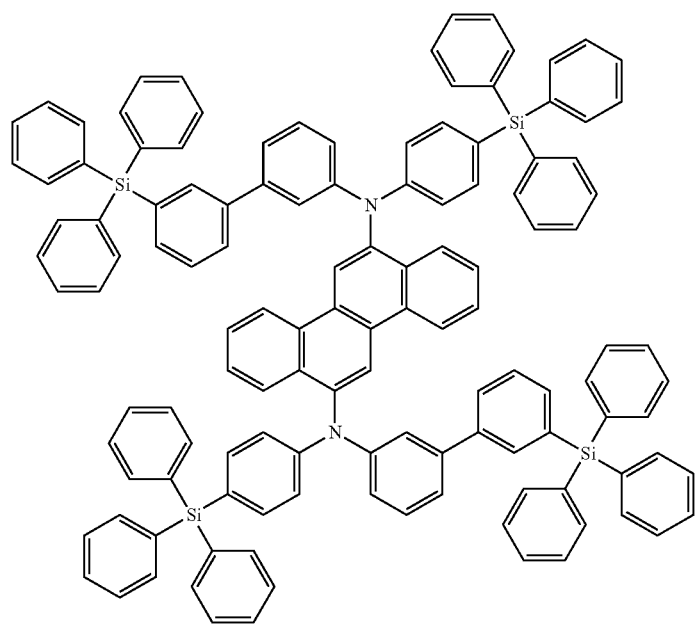
BD7
BD8

-continued
BD9
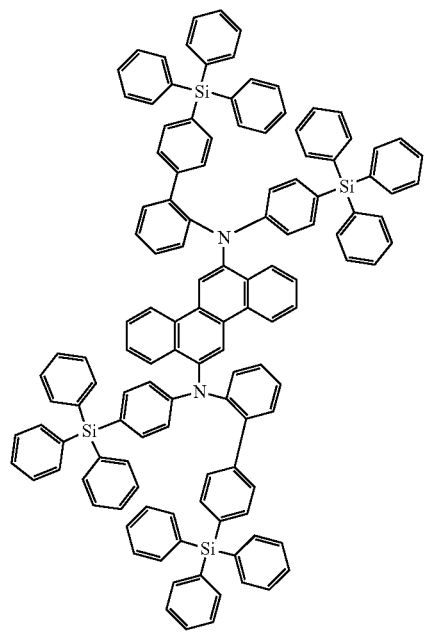
BD10
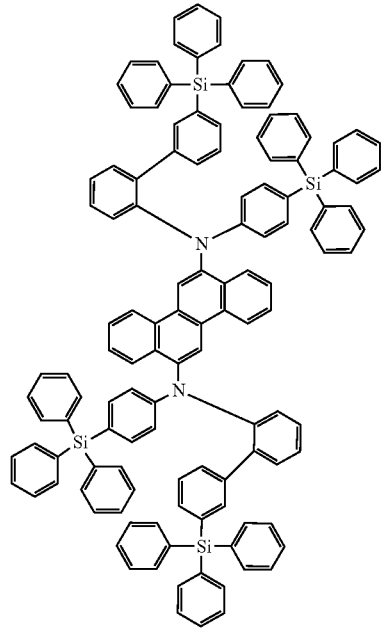
BD11
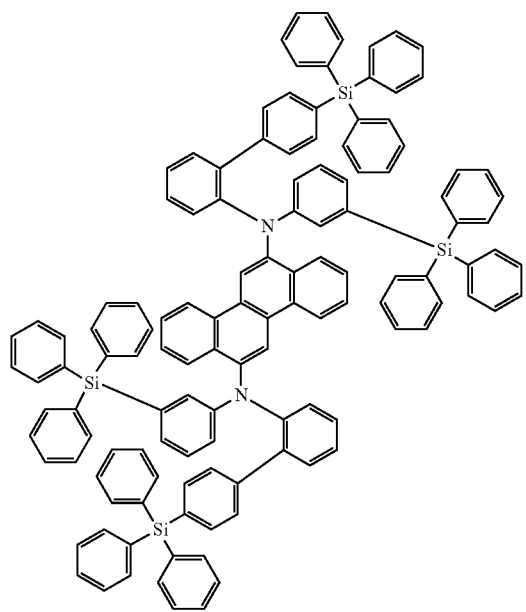
BD12
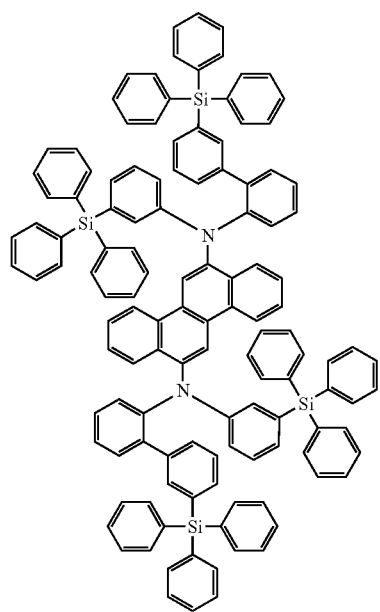

-continued
BD13
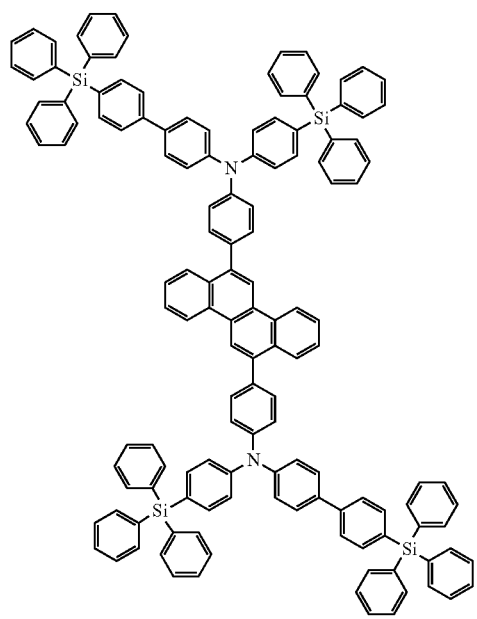
BD14
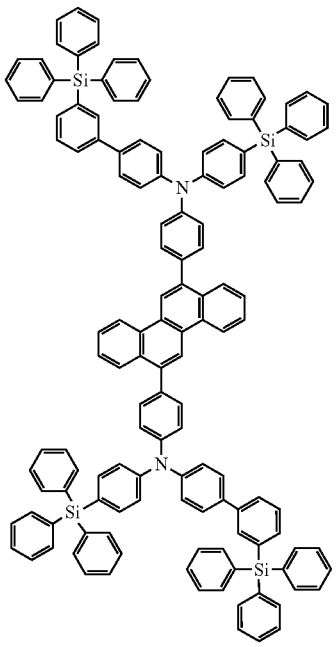
BD15
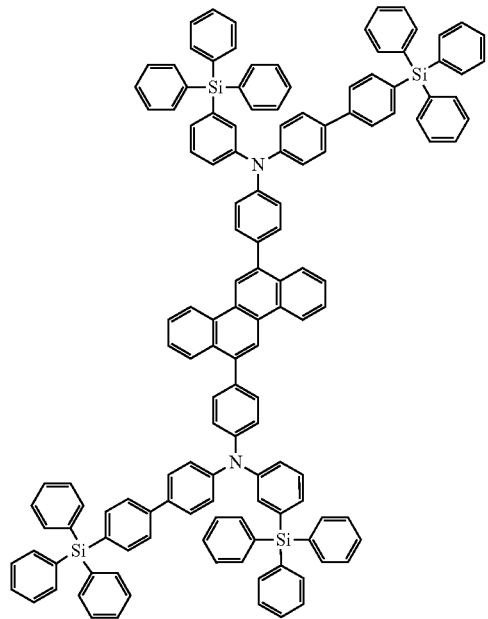
BD16
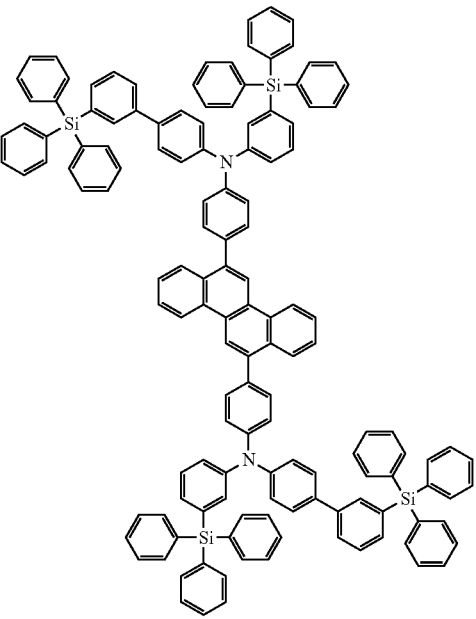

-continued
BD17
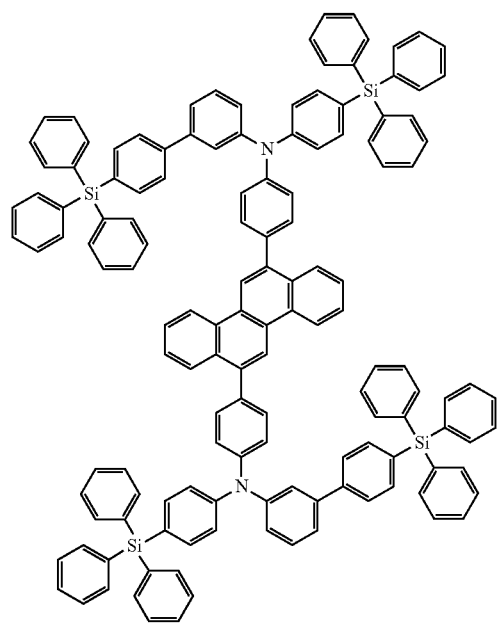
BD18
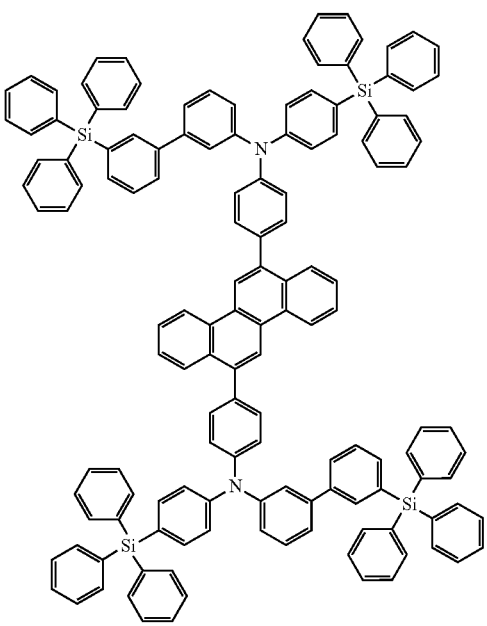
BD19
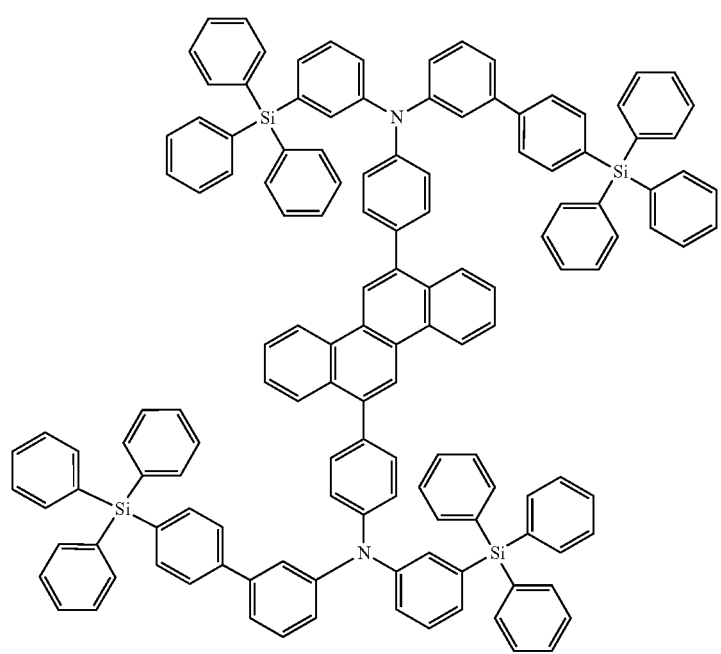

BD20
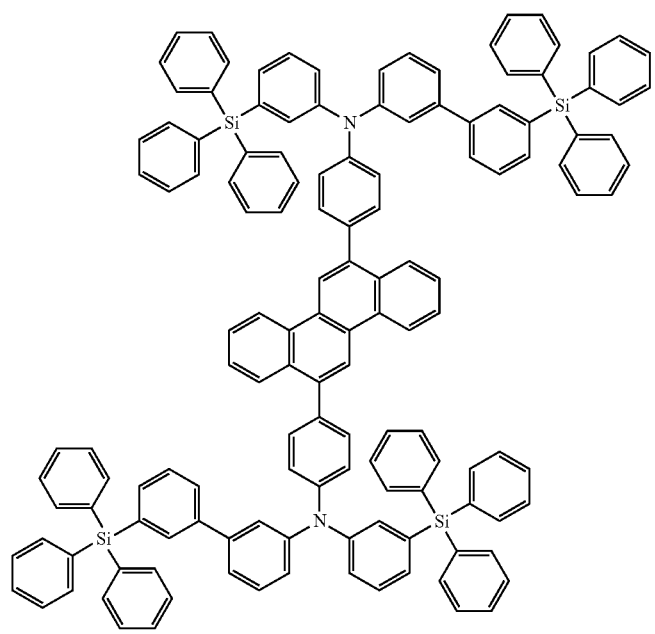
BD21
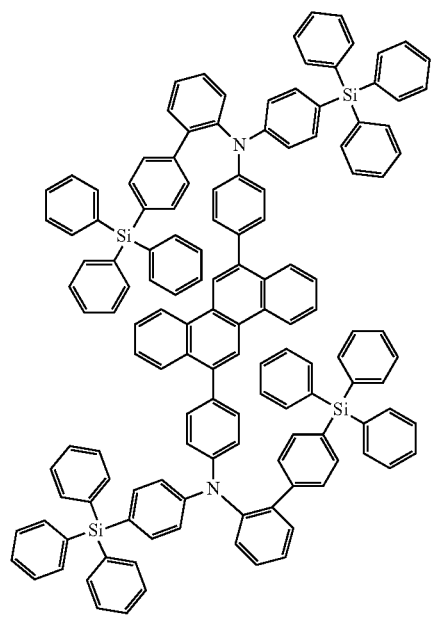
BD22
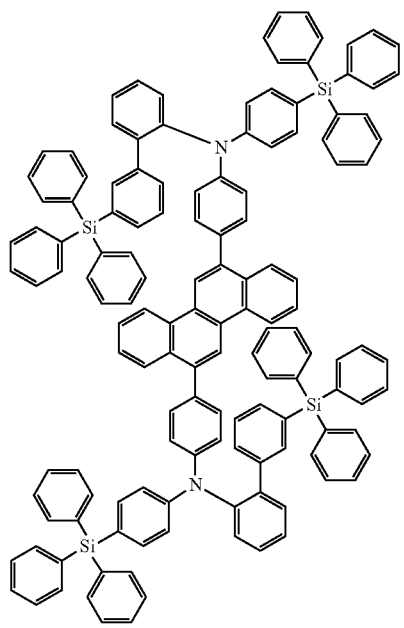

-continued
BD23
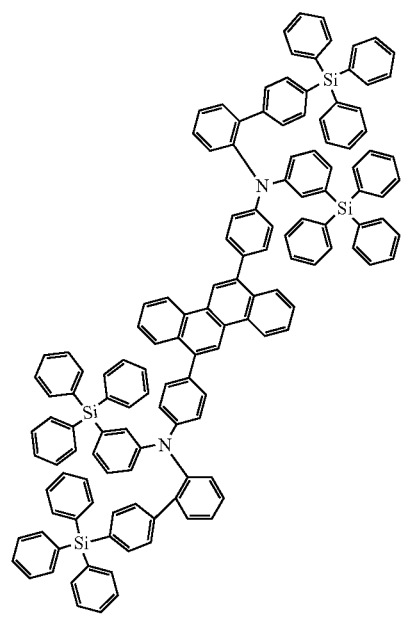
BD24
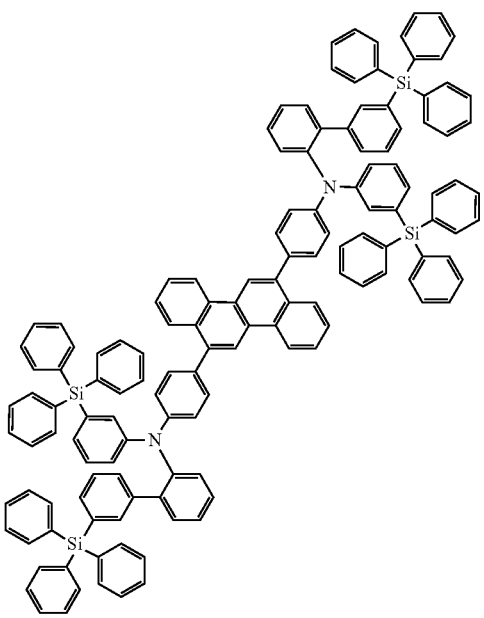
BD25
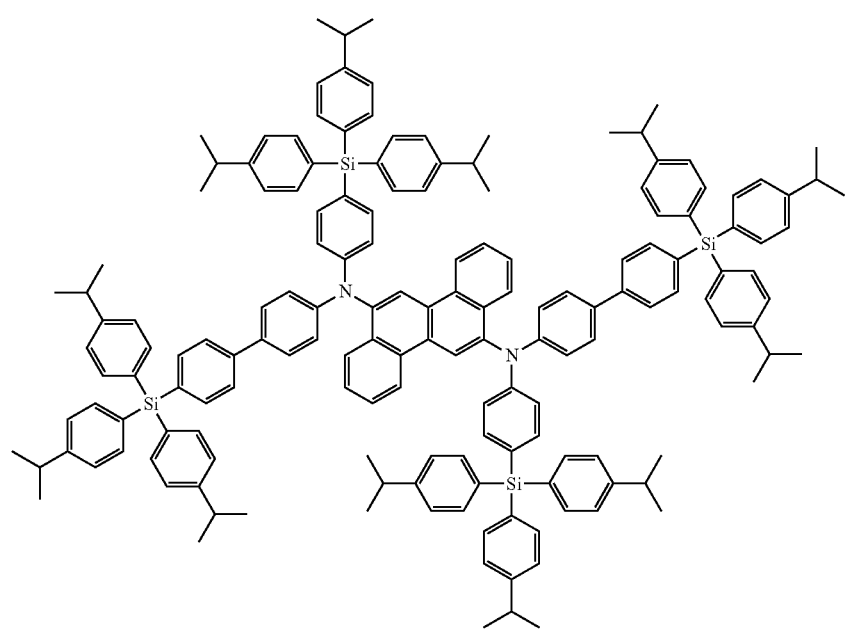

BD26
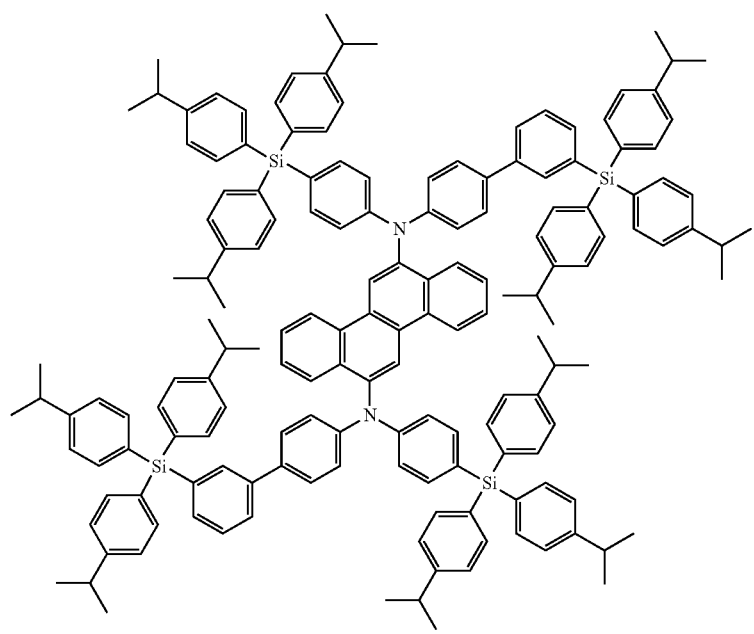
BD27
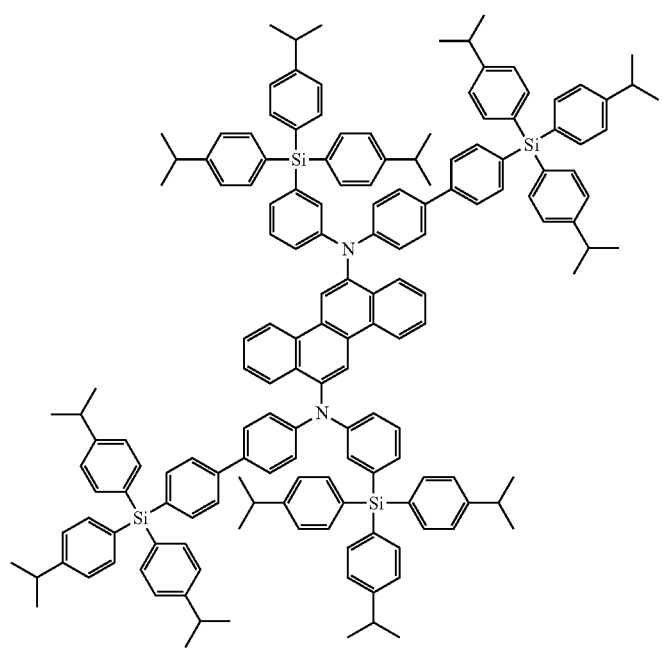

-continued
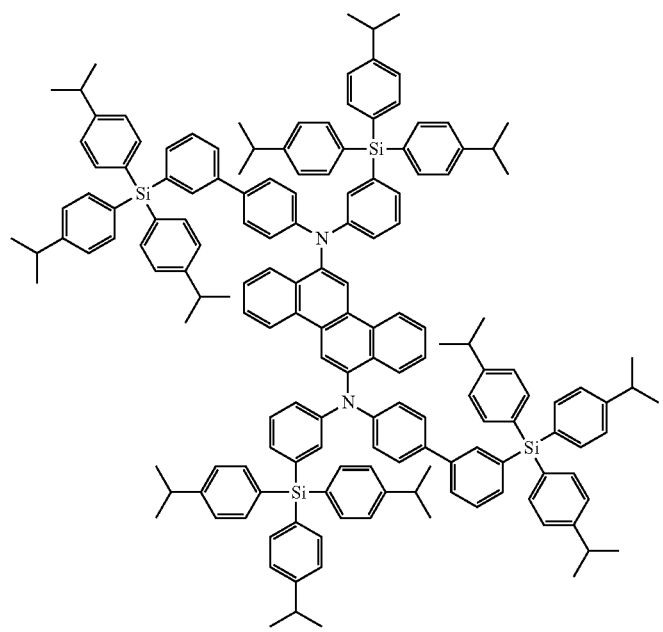
BD28
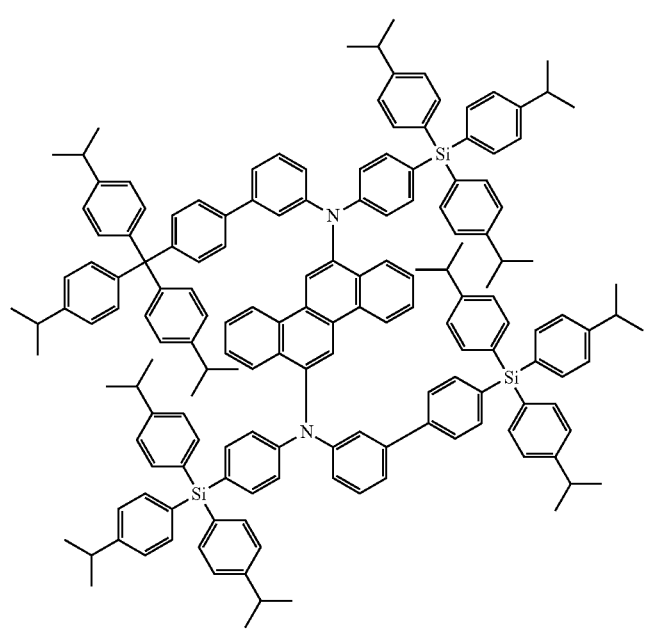
BD29

-continued
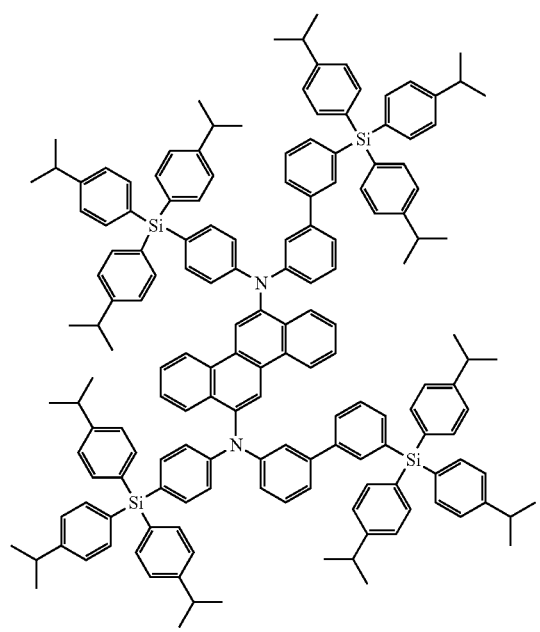
BD30
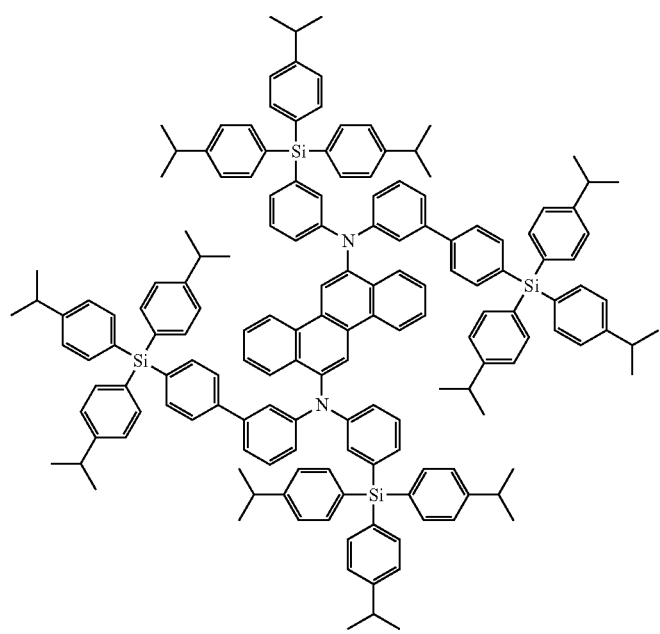
BD31

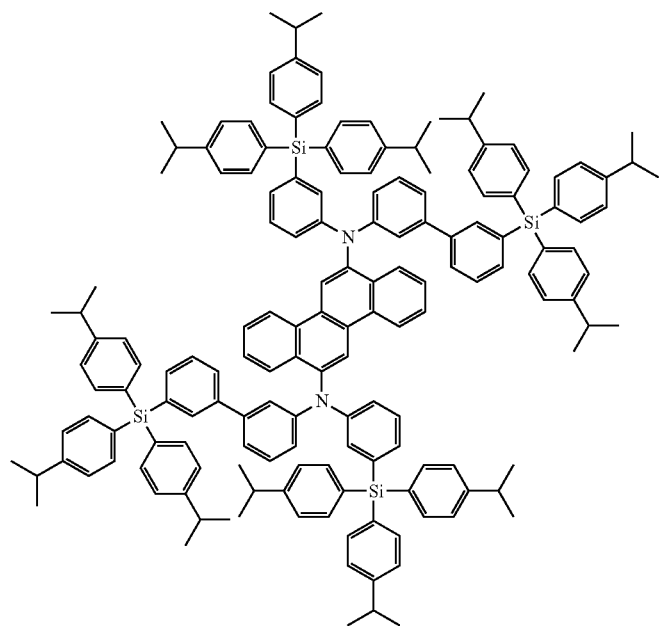
BD32
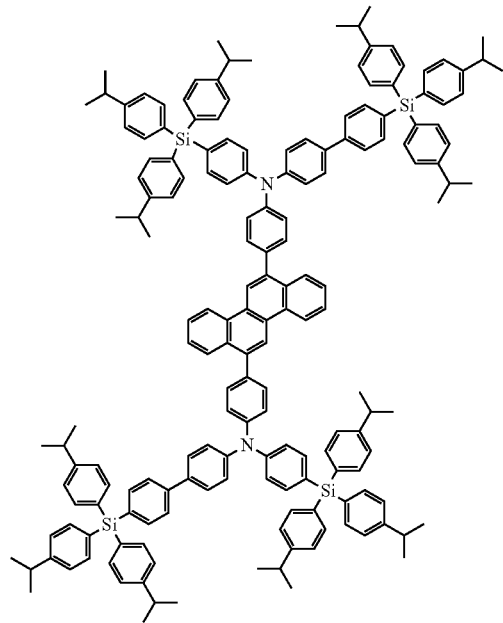
BD33
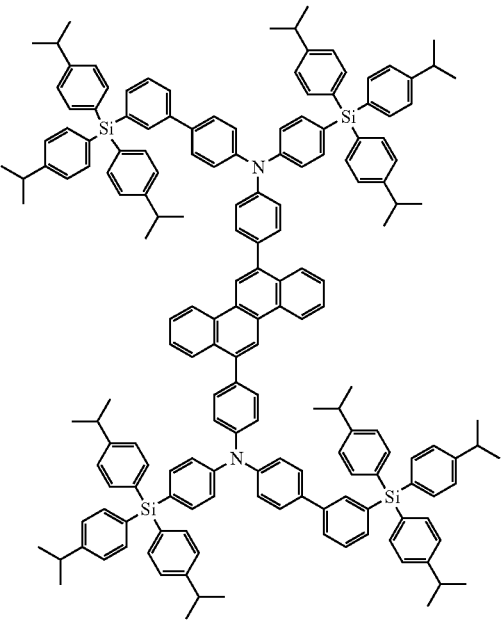
BD34

-continued
BD35
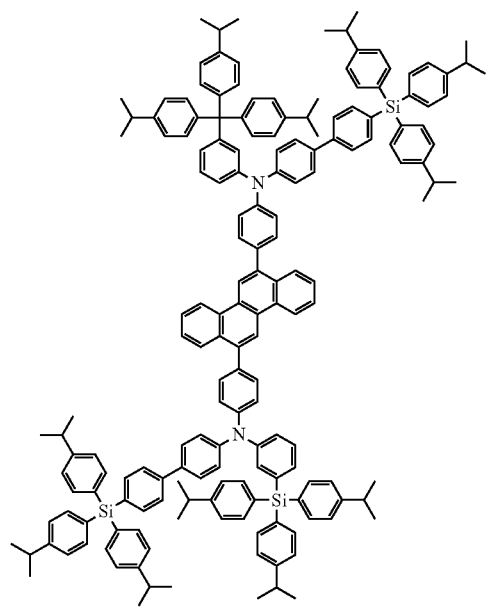
BD36
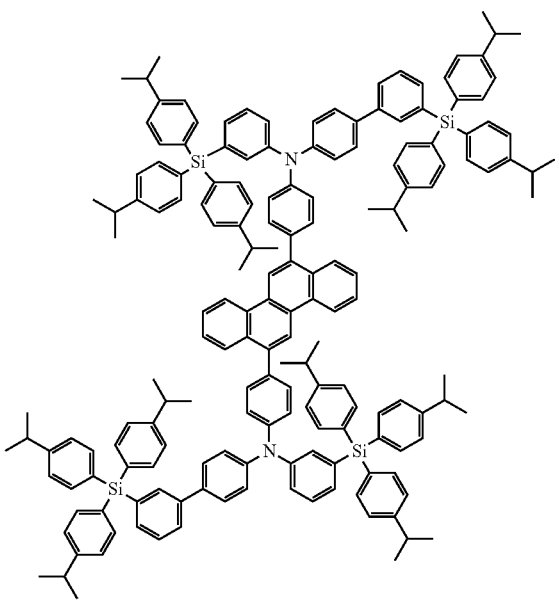
BD37
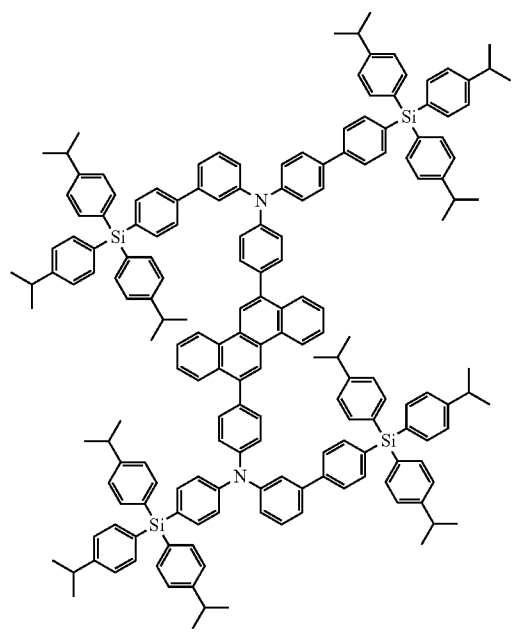
BD38
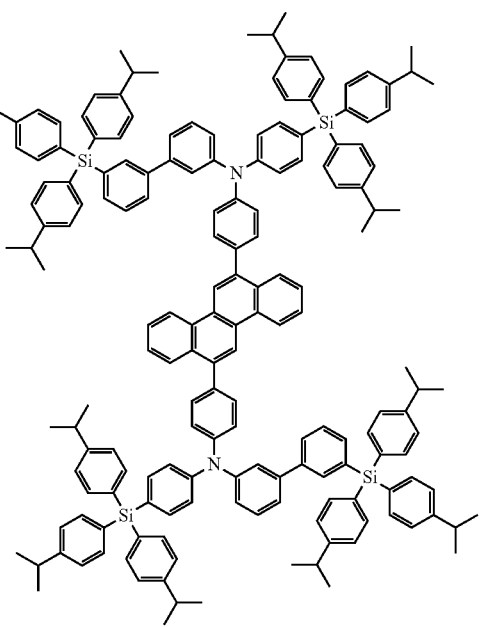

BD39

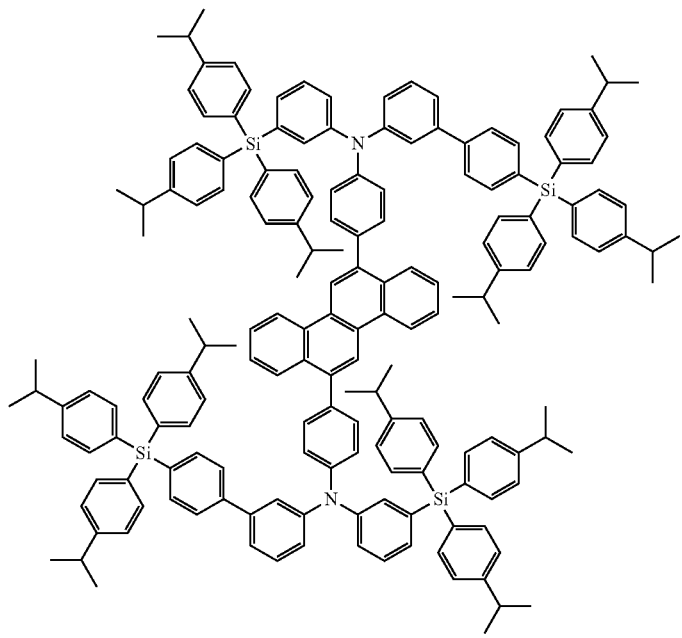

BD40

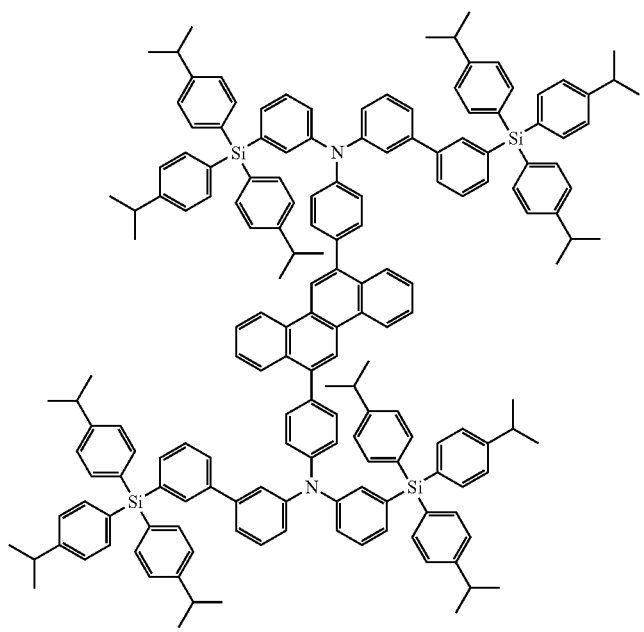

One embodiment of the present specification provides a coating composition comprising the compound.

According to one embodiment of the present specification, the coating composition may further comprise a solvent.

In one embodiment of the present specification, the coating composition may be a liquid phase. The "liquid phase" means in a liquid state at room temperature and atmospheric pressure.

In one embodiment of the present specification, examples of the solvent may include chlorine-based solvents such as chloroform, methylene chloride, 1,2-dichloroethane, 1,1,2-trichloroethane, chlorobenzene or o-dichlorobenzene; ether-based solvents such as tetrahydrofuran or dioxane; aromatic hydrocarbon-based solvents such as toluene, xylene, trimethylbenzene or mesitylene; aliphatic hydrocarbon-based solvents such as cyclohexane, methylcyclohexane, n-pentane, n-hexane, n-heptane, n-octane, n-nonane or n-decane; ketone-based solvents such as acetone, methyl ethyl ketone or cyclohexanone; ester-based solvents such as ethyl acetate, butyl acetate or ethyl cellosolve acetate; polyalcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin or 1,2-hexanediol, and derivatives thereof; alcohol-based solvents such as methanol, ethanol, propanol, isopropanol or cyclohexanol; sulfoxide-based solvents such as dimethyl sulfoxide; amide-based solvents such as N-methyl-2-pyrrolidone or N,N-dimethylformamide; benzoate-based solvents such as methyl benzoate, butyl benzoate or 3-phenoxybenzoate; tetraline, and the like, however, the solvent may be used without limit as long as it is a solvent capable of dissolving or dispersing the compound according to one embodiment of the present specification.

In another embodiment, the solvent may be used either alone as one type, or as a mixture mixing two or more solvent types.

In another embodiment, the solvent preferably has a boiling point of 40° C. to 250° C. and more preferably 60° C. to 230° C., however, the boiling point is not limited thereto.

In another embodiment, viscosity of the single or mixed solvent is preferably from 1 CP to 10 CP and more preferably from 3 CP to 8 CP, but is not limited thereto.

In another embodiment, the coating composition preferably has the compound in a concentration of 0.1 wt/v % to 20 wt/v % and more preferably 0.5 wt/v % to 5 wt/v %, however, the concentration is not limited thereto.

Another embodiment of the present specification provides an organic light emitting device formed using the coating composition.

In one embodiment of the present specification, the organic light emitting device comprises a first electrode; a second electrode; and one or more organic material layers provided between the first electrode and the second electrode, and one or more layers of the organic material layers comprise the coating composition.

In one embodiment of the present specification, the first electrode is a cathode, and the second electrode is an anode.

In another embodiment, the first electrode is an anode, and the second electrode is a cathode.

In one embodiment of the present specification, the organic material layer comprising the coating composition is a hole transfer layer, a hole injection layer, or a layer carrying out hole transfer and hole injection at the same time.

In one embodiment of the present specification, the organic material layer comprising the coating composition is a light emitting layer.

In another embodiment, the organic material layer comprising the coating composition is a light emitting layer, and the light emitting layer comprises the compound represented by Chemical Formula 1 as a host of the light emitting layer.

According to another embodiment, the organic material layer comprising the coating composition is a light emitting layer, and the light emitting layer comprises the compound represented by Chemical Formula 1 as a host of the light emitting layer, and may further comprise a dopant material. Herein, a mass ratio of the host and the dopant (host:dopant) is from 80:20 to 99:1. Specifically, the mass ratio may be from 90:10 to 99:1, and more specifically from 90:10 to 95:5.

In another embodiment, the organic material layer comprising the coating composition is a light emitting layer, and the light emitting layer comprises the compound represented by Chemical Formula 1 as a dopant of the light emitting layer.

In another embodiment, the organic material layer comprises a layer carrying out hole injection and hole transfer at the same time and a light emitting layer, and the light emitting layer may further comprise a dopant material.

As the dopant material, those known in the art may be used, and for example, pyrene or chrysene-based materials may be used, however, the dopant material is not limited thereto.

In one embodiment of the present specification, the organic light emitting device may further comprise, one, two or more layers selected from the group consisting of a hole injection layer, a hole transfer layer, an electron transfer layer, an electron injection layer, an electron blocking layer and a hole blocking layer.

In another embodiment, the organic light emitting device may be an organic light emitting device having a structure in which an anode, one or more organic material layers and a cathode are consecutively laminated on a substrate (normal type).

In another embodiment, the organic light emitting device may be an organic light emitting device having a structure in a reverse direction in which a cathode, one or more organic material layers and an anode are consecutively laminated on a substrate (inverted type).

The organic material layer of the organic light emitting device of the present specification may be formed in a single layer structure, but may also be formed in a multilayer structure in which two or more organic material layers are laminated. For example, the organic light emitting device of the present specification may have a structure comprising a hole injection layer, a hole transfer layer, a light emitting layer, an electron transfer layer, an electron injection layer and the like as the organic material layer. However, the structure of the organic light emitting device is not limited thereto, and may comprise less numbers of organic layers.

For example, a structure of the organic light emitting device according to one embodiment of the present specification is illustrated in the FIGURE.

The FIGURE illustrates a structure of the organic light emitting device in which an anode (201), a hole injection layer (301), a hole transfer layer (401), a light emitting layer (501), an electron transfer layer (601) and a cathode (701) are consecutively laminated on a substrate (101).

In one embodiment of the present specification, the hole injection layer (301), the hole transfer layer (401) or the light emitting layer (501) of the FIGURE may be formed using the coating composition comprising the compound represented by Chemical Formula 1.

In one embodiment of the present specification, the hole injection layer (301) of the FIGURE may be formed using the coating composition comprising the compound represented by Chemical Formula 1.

In one embodiment of the present specification, the hole transfer layer (401) of the FIGURE may be formed using the coating composition comprising the compound represented by Chemical Formula 1.

In one embodiment of the present specification, the light emitting layer (501) of the FIGURE may be formed using the coating composition comprising the compound represented by Chemical Formula 1.

The FIGURE illustrates the organic light emitting device, however, the organic light emitting device is not limited thereto.

When the organic light emitting device comprises a plurality of organic material layers, the organic material layers may be formed with materials that are the same as or different from each other.

The organic light emitting device of the present specification may be manufactured using materials and methods known in the art, except that one or more layers of the organic material layers are formed using the coating composition comprising the compound represented by Chemical Formula 1.

For example, the organic light emitting device of the present specification may be manufactured by consecutively laminating an anode, an organic material layer and a cathode on a substrate. Herein, the organic light emitting device may be manufactured by forming an anode on a substrate by depositing a metal, a metal oxide having conductivity, or an alloy thereof using a physical vapor deposition (PVD) method such as sputtering or e-beam evaporation, and forming an organic material layer comprising a hole injection layer, a hole transfer layer, a light emitting layer, an electron injection layer and an electron transfer layer thereon through a deposition or solution process, and then depositing a material usable as a cathode thereon. In addition to such a method, the organic light emitting device may also be manufactured by consecutively depositing a cathode material, an organic material layer material and an anode material on a substrate.

As the anode material, materials having large work function are normally preferred so that hole injection to an organic material layer is smooth. Specific examples of the anode material usable in the present specification include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

As the cathode material, materials having small work function are normally preferred so that electron injection to an organic material layer is smooth. Specific examples of the cathode material include metals such as barium, magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection layer is a layer that injects holes from an electrode, and as the hole injection material, compounds having an ability to transfer holes, and therefore, having a hole injection effect in an anode and having an excellent hole injection effect for a light emitting layer or a light emitting material are preferred. In addition, compounds preventing excitons generated in the light emitting layer from moving to an electron injection layer or an electron injection material, and having an excellent thin film forming ability are preferred. In addition, the highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials; hexanitrile hexaazatriphenylene-based organic materials; quinacridone-based organic materials; perylene-based organic materials; anthraquinone, and polyaniline- and polythiophene-based conductive polymers, and the like, but are not limited thereto.

The hole transfer layer is a layer that receives holes from a hole injection layer and transfers the holes to a light emitting layer, and as the hole transfer material, materials capable of receiving holes from an anode or a hole injection layer, moving the holes to a light emitting layer, and having high mobility for the holes are suitable. Specific examples thereof include arylamine-based organic materials, conductive polymers, block copolymers having conjugated parts and non-conjugated parts together, and the like, but are not limited thereto.

The light emitting material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxy-quinoline aluminum complexes ($Alq_3$); carbazole-based compounds; dimerized styryl compounds; BAlq; 10-hydroxybenzo quinoline-metal compounds; benzoxazole-, benzthiazole- and benzimidazole-based compounds; poly(p-phenylenevinylene) (PPV)-based polymers; spiro compounds; polyfluorene, rubrene, or the like, but are not limited thereto.

The light emitting layer may include a host material and a dopant material. The host material includes fused aromatic ring derivatives, heteroring-containing compounds or the like. Specifically, the fused aromatic ring derivative includes anthracene derivatives, pyrene derivatives, naphthalene derivatives, pentacene derivatives, phenanthrene compounds, fluoranthene compounds and the like, and the heteroring-containing compound includes carbazole derivatives, dibenzofuran derivatives, ladder-type furan compounds, pyrimidine derivatives and the like, however, the material is not limited thereto.

The dopant material includes aromatic amine derivatives, styrylamine compounds, boron complexes, fluoranthene compounds, pyrene derivatives, metal complexes and the like. Specifically, the aromatic amine derivative is a fused aromatic ring derivative having a substituted or unsubstituted arylamine group and includes arylamine group-including pyrene, anthracene, chrysene, peryflanthene and the like. In addition, the styrylamine compound is a compound in which substituted or unsubstituted arylamine is substituted with at least one arylvinyl group, and the substituted or unsubstituted arylamine means an arylamine group in which one, two or more substituents selected from the group consisting of an aryl group, a silyl group, an alkyl group, a cycloalkyl group and an arylamine group are substituted or unsubstituted. Specifically, styrylamine, styryldiamine, styryltriamine, styryltetramine or the like is included, however, the styrylamine compound is not limited thereto. In addition, the metal complex includes iridium complexes, platinum complexes or the like, but is not limited thereto.

The electron injection layer is a layer that injects electrons from an electrode, and as the electron injection material, compounds having an ability to transfer electrons, having an electron injection effect from a cathode, having an excellent electron injection effect for a light emitting layer or a light emitting material are preferred. In addition, compounds preventing excitons generated in the light emitting layer from moving to a hole injection layer, and having an excellent thin film forming ability are preferred. Specific examples thereof include fluorenone, anthraquinodimethane, diphenoquinone, thiopyran dioxide, oxazole, oxadiazole, triazole, imidazole, benzimidazole, perylene tetracarboxylic acid, fluorenylidene methane, anthrone and derivatives thereof, metal complex compounds, nitrogen-containing 5-membered ring derivatives, and the like, but are not limited there.

The electron transfer layer is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suitable. Specific examples thereof include Al complexes of 8-hydroxyquinoline; complexes including $Alq_3$; organic radical compounds; hydroxyflavon-metal complexes, and the like, but are not limited thereto. In addition, the electron transfer layer may be used together with any desired cathode material as used in the art. Particularly, the suitable cathode material includes common materials that have small work function, and in which an aluminum layer or a silver layer follows. Specific examples thereof may include cesium, barium, calcium, ytterbium and samarium, and in each case, an aluminum layer or a silver layer follows.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)berylium, bis(10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer blocking holes from reaching a cathode, and generally, may be formed under the same condition as the hole injection layer. Specific examples thereof may include oxadiazole derivatives or triazole derivatives, phenanthroline derivatives, BCP, aluminum complexes and the like, but are not limited thereto.

The organic light emitting device according to the present specification may be a top-emission type, a bottom-emission type or a dual-emission type depending on the materials used.

In one embodiment of the present specification, the compound may be comprised in an organic solar cell or an organic transistor in addition to the organic light emitting device.

Another embodiment of the present specification provides a method for manufacturing an organic light emitting device formed using the coating composition.

Specifically, in one embodiment of the present specification, the method for manufacturing an organic light emitting device comprises preparing a substrate; forming a first electrode on the substrate; forming one or more organic material layers on the first electrode; and forming a second electrode on the organic material layer, wherein the forming of organic material layers comprises forming one or more organic material layers using the coating composition.

In one embodiment of the present specification, the forming of one or more organic material layers using the coating composition uses a spin coating method.

In another embodiment, the forming of one or more organic material layers using the coating composition uses a printing method.

In an embodiment of the present specification, examples of the printing method include inkjet printing, nozzle printing, offset printing, transfer printing, screen printing or the like, but are not limited thereto.

The coating composition according to one embodiment of the present specification is suited for a solution process due to its structural properties and may be formed using a printing method, and therefore, is economically effective in terms of time and costs when manufacturing a device.

In one embodiment of the present specification, the forming of one or more organic material layers using the coating composition comprises coating the coating composition on the first electrode; and drying the coated coating composition.

In one embodiment of the present specification, the drying may be performed through heat treatment, and a heat treatment temperature in the drying through heat treatment is from 60° C. to 180° C. According to one embodiment, the temperature may be from 80° C. to 180° C., and in another embodiment, the temperature may be from 120° C. to 180° C.

In another embodiment, a heat treatment time in the drying through heat treatment is from 1 minute to 1 hour. According to one embodiment, the time may be from 1 minute to 30 minutes, and in another embodiment, the time may be from 10 minutes to 30 minutes. When satisfying the above-mentioned heat treatment time range, the solvent may be completely removed.

When the drying through heat treatment is included in the forming of one or more organic material layers using the coating composition, being dissolved by a solvent or being morphologically affected or decomposed may be prevented when other layers are laminated on a surface of the organic material layer formed using the coating composition.

Hereinafter, the present specification will be described in detail with reference to examples in order to specifically describe the present specification. However, the examples according to the present specification may be modified to various different forms, and the scope of the present specification is not to be construed as being limited to the examples described below. Examples of the present specification are provided in order to more fully describe the present specification to those having average knowledge in the art.

PREPARATION EXAMPLE

Preparation Example 1

(1) Synthesis of Intermediate 1

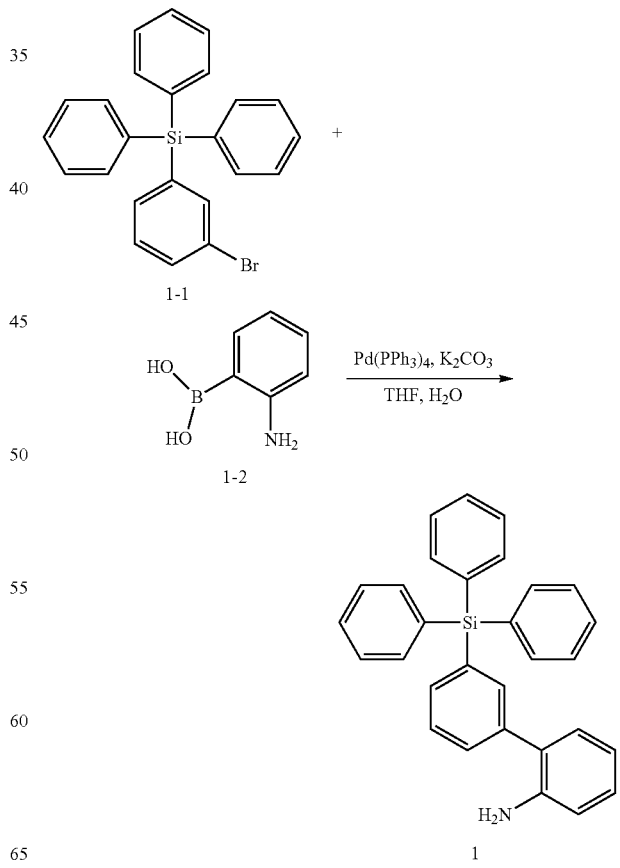

Intermediate 1-1 (7 g, 16.85 mmol), Intermediate 1-2 (2.77 g, 20.22 mol), Pd(PPh$_3$)$_4$ (973 mg, 0.84 mmol) and K$_2$CO$_3$ (7 g, 50.55 mmol) were introduced to a 500 mL round bottom flask. Under a nitrogen condition, tetrahydrofuran (THF) (200 ml) and H$_2$O (50 ml) were introduced thereto, and the result was stirred for 8 hours after raising the temperature to 80° C. After lowering the temperature, the material was extracted using dichloromethane (DCM) and water, and the result was stirred after introducing MgSO$_4$ and acid clay. After passing the result through silica gel, the solvent was removed. The material was separated through column chromatography (methyl chloride/hexane).

(2) Synthesis of Intermediate 2

9.57 mmol) were introduced to a 250 ml round bottom flask. Under a nitrogen condition, toluene (100 ml) was introduced thereto, and the temperature was raised to 100° C. After introducing Pd(P(tBu$_3$))$_2$ (163 mg, 0.32 mmol) to the round bottom flask and blocking the light, the result was stirred for 2 hours. After lowering the temperature, the material was extracted using dichloromethane (DCM) and water, and the result was stirred after introducing MgSO$_4$ and acid clay. After passing the result through silica gel, the solvent was removed. The material was separated through column chromatography (methyl chloride/hexane).

(3) Synthesis of Compound BD12

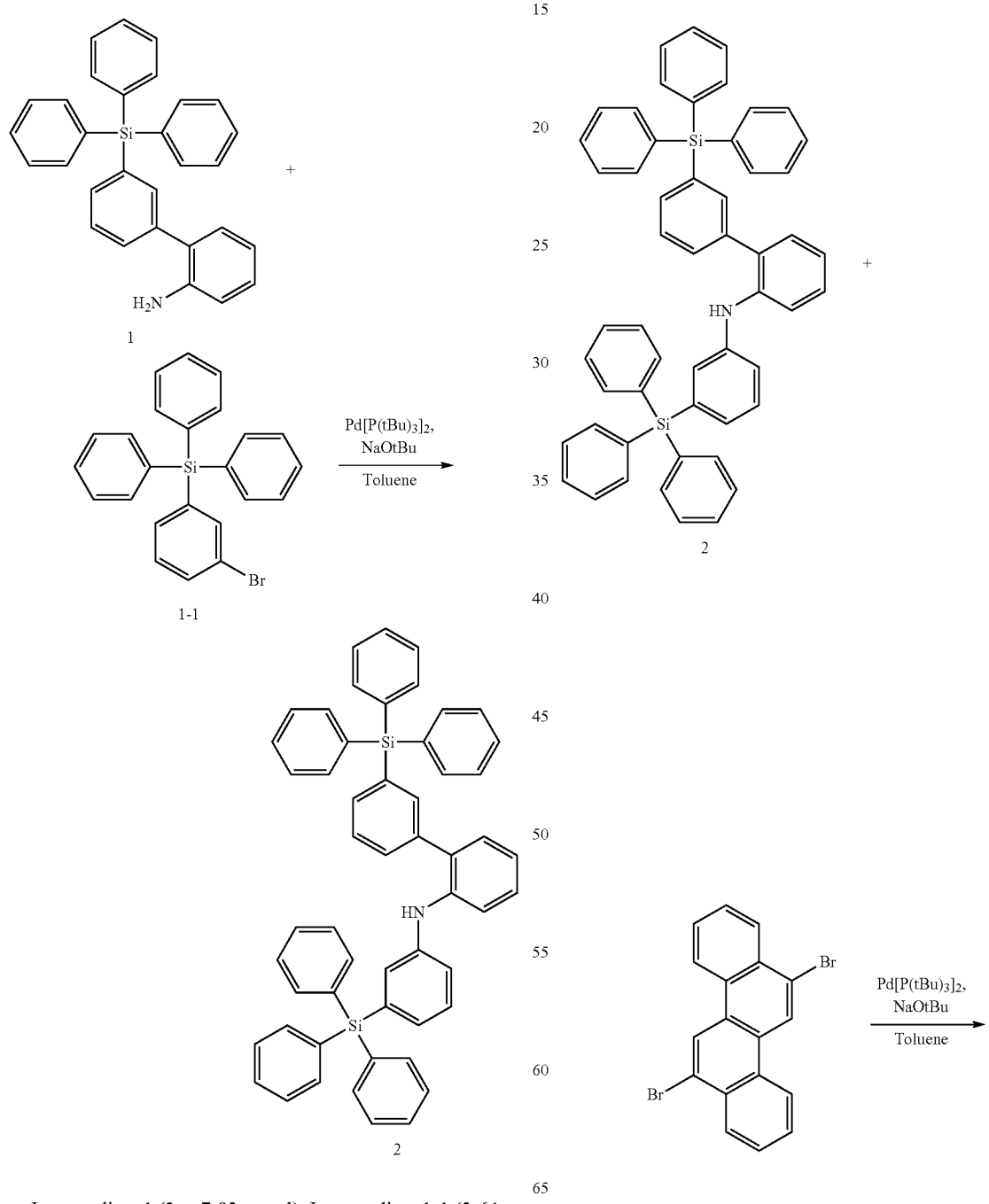

Intermediate 1 (3 g, 7.02 mmol), Intermediate 1-1 (2.64 g, 6.38 mmol) and sodium tert-butoxide (NaOtBu) (920 mg, -continued

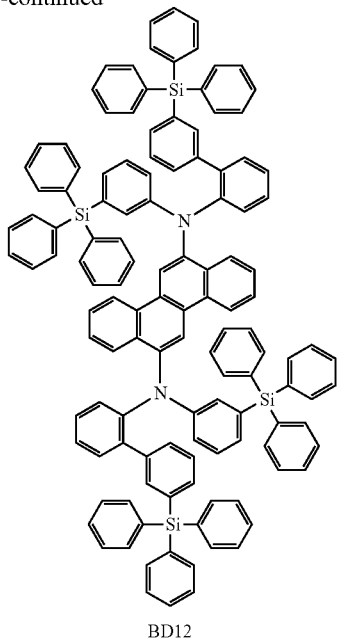

BD12

Preparation Example 2

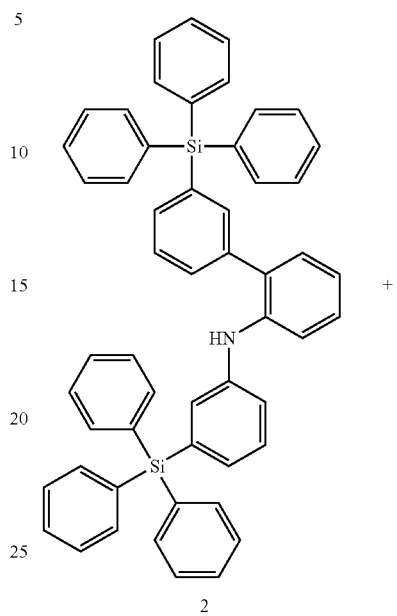

Intermediate 2 (2 g, 2.62 mmol), dibromochrysene (460 mg, 1.2 mmol) and sodium tert-butoxide (NaOtBu) (286 mg, 3 mmol) were introduced to a 250 ml round bottom flask. Under a nitrogen condition, toluene (100 ml) was introduced thereto, and the temperature was raised to 100° C. After introducing Pd(P(tBu$_3$))$_2$ (122 mg, 0.16 mmol) to the round bottom flask and blocking the light, the result was stirred for 2 hours. After lowering the temperature, the material was extracted using dichloromethane (DCM) and water, and the result was stirred after introducing MgSO$_4$ and acid clay. After passing the result through silica gel, the solvent was removed. The material was separated through column chromatography (methyl chloride/hexane). Purification was further performed through recrystallization (methyl chloride/hexane).

*Compound BD12

$^1$H-NMR (CDCl$_3$): 8.7(2H), 8.13-7.9(8H), 7.7-7.6(8H), 7.55-7.3(70H), 7.18-7(6H)

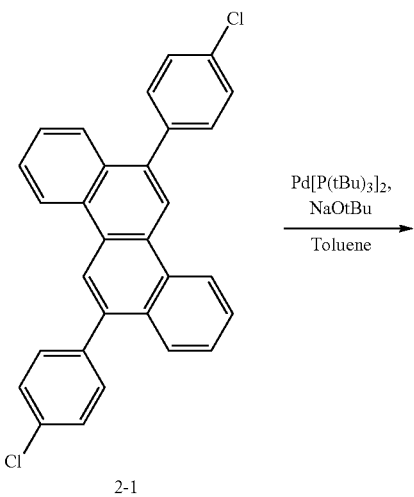

2-1

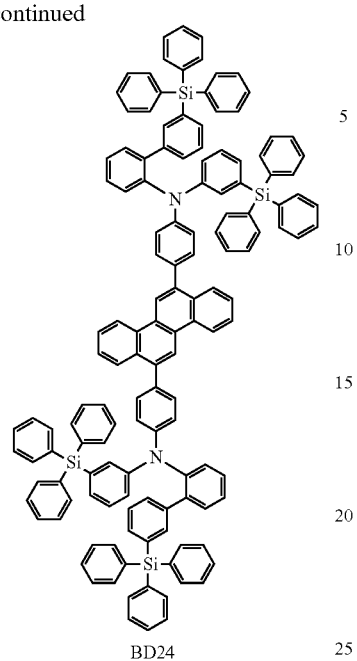

BD24

Intermediate 2 (2 g, 2.62 mmol), Intermediate 2-1 (536 mg, 1.2 mmol) and sodium tert-butoxide (NaOtBu) (286 mg, 3 mmol) were introduced to a 250 ml round bottom flask. Under a nitrogen condition, toluene (100 ml) was introduced thereto, and the temperature was raised to 100° C. After introducing Pd(P(tBu$_3$))$_2$ (122 mg, 0.16 mmol) to the round bottom flask and blocking the light, the result was stirred for 2 hours. After lowering the temperature, the material was extracted using dichloromethane (DCM) and water, and the result was stirred after introducing MgSO$_4$ and acid clay. After passing the result through silica gel, the solvent was removed. The material was separated through column chromatography (methyl chloride/hexane). Purification was further performed through recrystallization (methyl chloride/hexane).

*Compound BD24

$^1$H-NMR (CDCl$_3$): 9.5(2H), 8.64(2H), 8.2-7.9(6H), 7.7-7.54(14H), 7.45-7.32(72H), 7.2-7.1(6H)

Preparation Example 3

(1) Synthesis of Intermediate 3

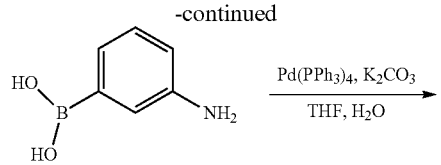

3-2

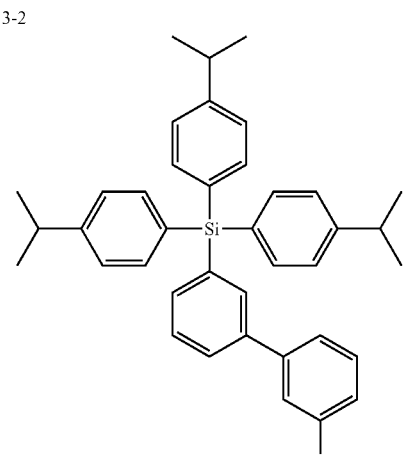

3

Intermediate 3-1 (7 g, 12.92 mmol), Intermediate 3-2 (2.12 g, 15.5 mmol), Pd(PPh$_3$)$_4$ (746 mg, 0.64 mmol) and K$_2$CO$_3$ (5.34 g, 38.77 mmol) were introduced to a 500 mL round bottom flask. Under a nitrogen condition, tetrahydrofuran (THF) (200 ml) and H$_2$O (50 ml) were introduced thereto, and the result was stirred for 8 hours after raising the temperature to 80° C. After lowering the temperature, the material was extracted using dichloromethane (DCM) and water, and the result was stirred after introducing MgSO$_4$ and acid clay. After passing the result through silica gel, the solvent was removed. The material was separated through column chromatography (methyl chloride/hexane).

(2) Synthesis of Intermediate 4

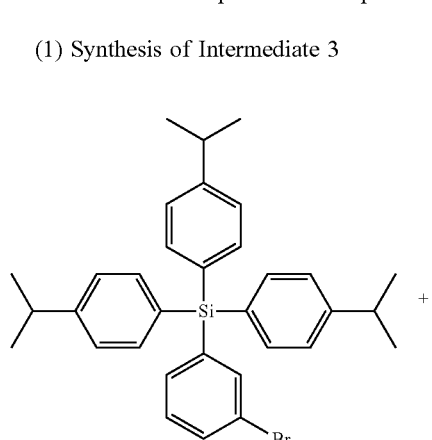

3-1

+

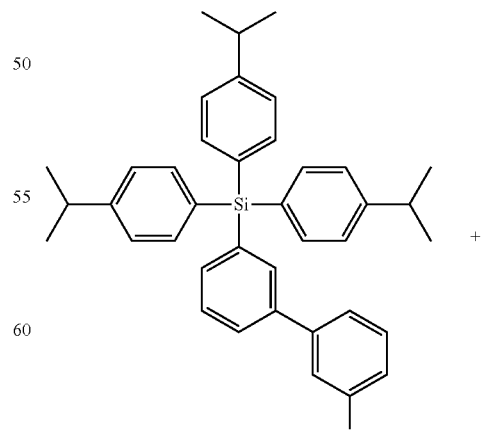

3

51

-continued

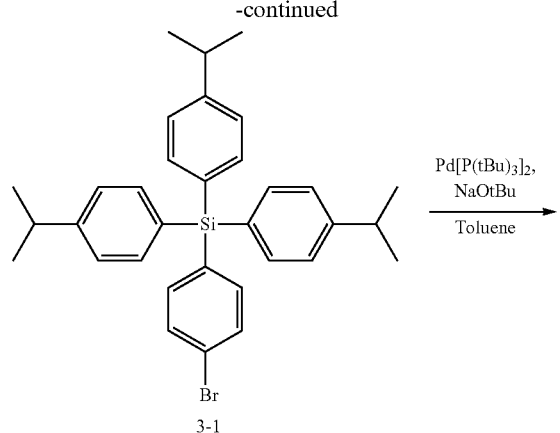

3-1

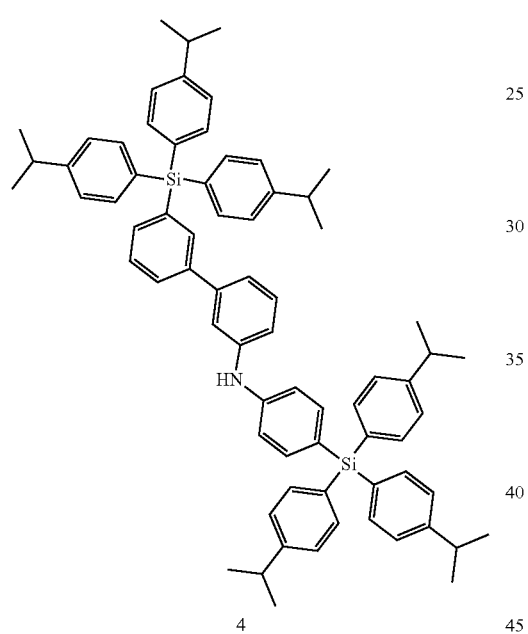

4

Intermediate 3 (3 g, 5.42 mmol), Intermediate 3-1 (2.04 g, 4.92 mmol) and sodium tert-butoxide (NaOtBu) (710 mg, 7.4 mmol) were introduced to a 250 ml round bottom flask. Under a nitrogen condition, toluene (100 ml) was introduced thereto, and the temperature was raised to 100° C. After introducing Pd(P(tBu₃))₂ (125 mg, 0.24 mmol) to the round bottom flask and blocking the light, the result was stirred for 2 hours. After lowering the temperature, the material was extracted using dichloromethane (DCM) and water, and the result was stirred after introducing MgSO₄ and acid clay. After passing the result through silica gel, the solvent was removed. The material was separated through column chromatography (methyl chloride/hexane).

52

(3) Synthesis of Compound BD30

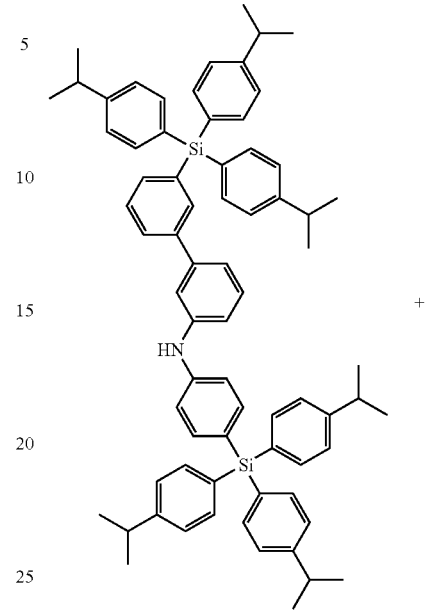

4

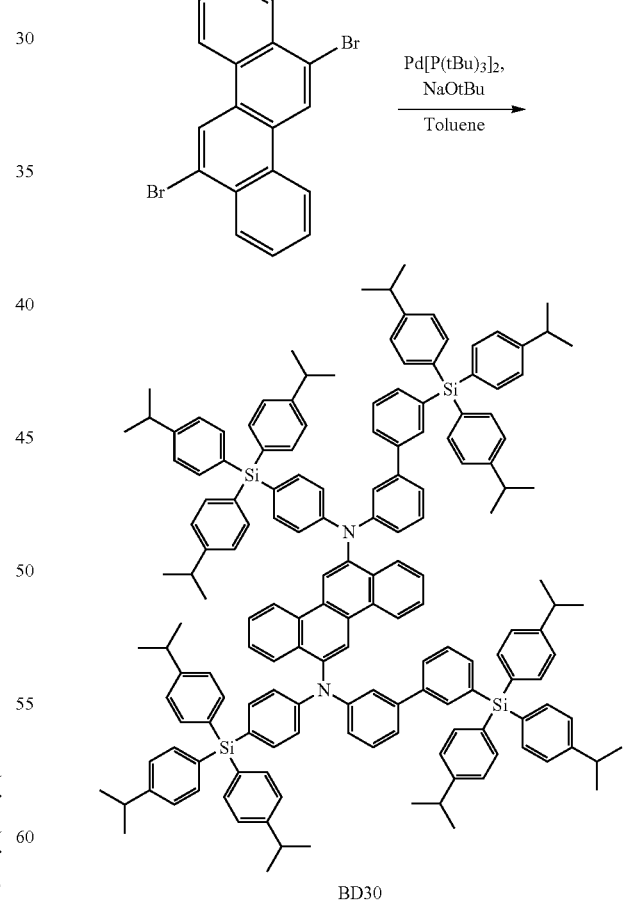

BD30

Intermediate 4 (2 g, 1.97 mmol), dibromochrysene (346 mg, 0.9 mmol) and sodium tert-butoxide (NaOtBu) (215 mg, 2.24 mmol) were introduced to a 250 ml round bottom flask.

Under a nitrogen condition, toluene (100 ml) was introduced thereto, and the temperature was raised to 100° C. After introducing Pd(P(tBu$_3$))$_2$ (91.6 mg, 0.18 mmol) to the round bottom flask and blocking the light, the result was stirred for 2 hours. After lowering the temperature, the material was extracted using dichloromethane (DCM) and water, and the result was stirred after introducing MgSO$_4$ and acid clay. After passing the result through silica gel, the solvent was removed. The material was separated through column chromatography (methyl chloride/hexane). Purification was further performed through recrystallization (methyl chloride/hexane).

*Compound BD30

$^1$H-NMR (CDCl$_3$): 8.7(2H), 8.1-7.9(6H), 7.7-7.6(8H), 7.55-7.3(62H), 7.18-7(4H), 2.85(12H), 1.2(72H)

Preparation Example 4

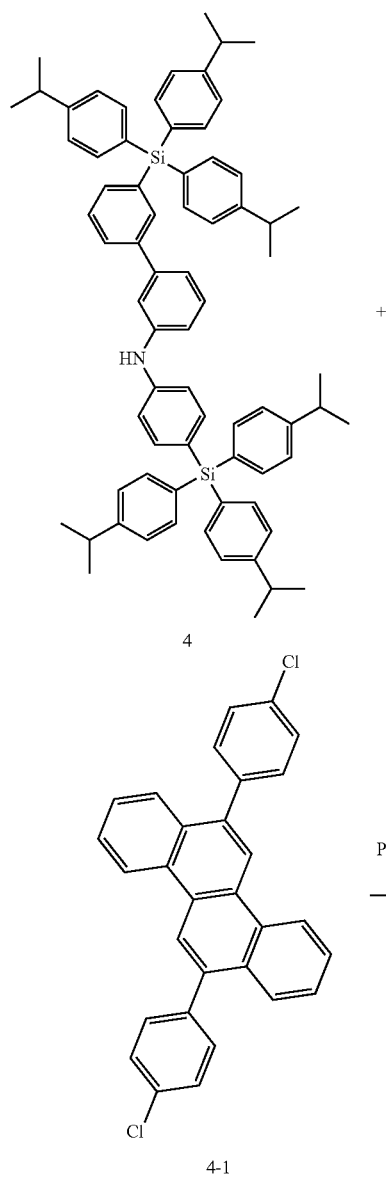

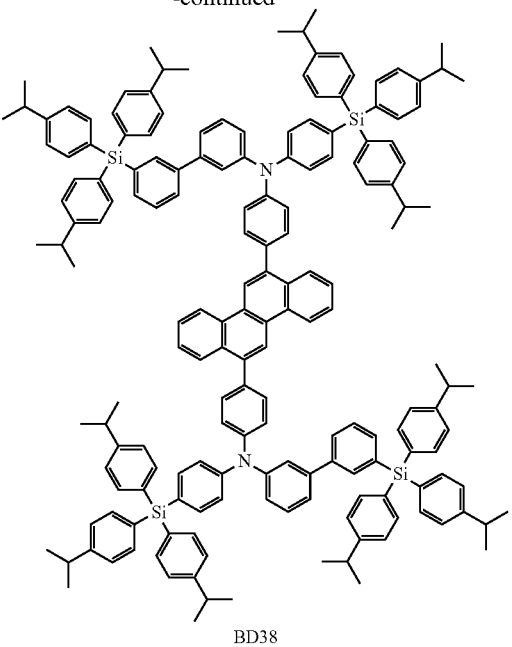

BD38

Intermediate 4 (2 g, 1.97 mmol), Intermediate 4-1 (403 mg, 0.9 mmol) and sodium tert-butoxide (NaOtBu) (215 mg, 2.24 mmol) were introduced to a 250 ml round bottom flask. Under a nitrogen condition, toluene (100 ml) was introduced thereto, and the temperature was raised to 100° C. After introducing Pd(P(tBu$_3$))$_2$ (91.6 mg, 0.18 mmol) to the round bottom flask and blocking the light, the result was stirred for 2 hours. After lowering the temperature, the material was extracted using dichloromethane (DCM) and water, and the result was stirred after introducing MgSO$_4$ and acid clay. After passing the result through silica gel, the solvent was removed. The material was separated through column chromatography (methyl chloride/hexane). Purification was further performed through recrystallization (methyl chloride/hexane).

*Compound BD38

$^1$H-NMR (CDCl$_3$): 9.5(2H), 8.64(2H), 8.2-7.9(4H), 7.7-7.53(16H), 7.45-7.3(62H), 7.2-7.1(4H), 2.85(12H), 1.2(72H)

Example

Example 1

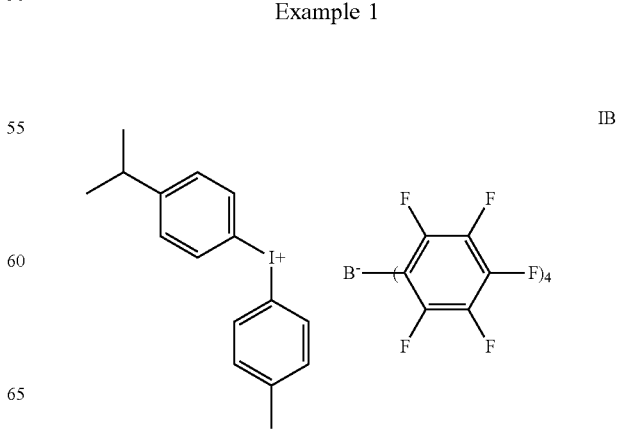

IB

-continued

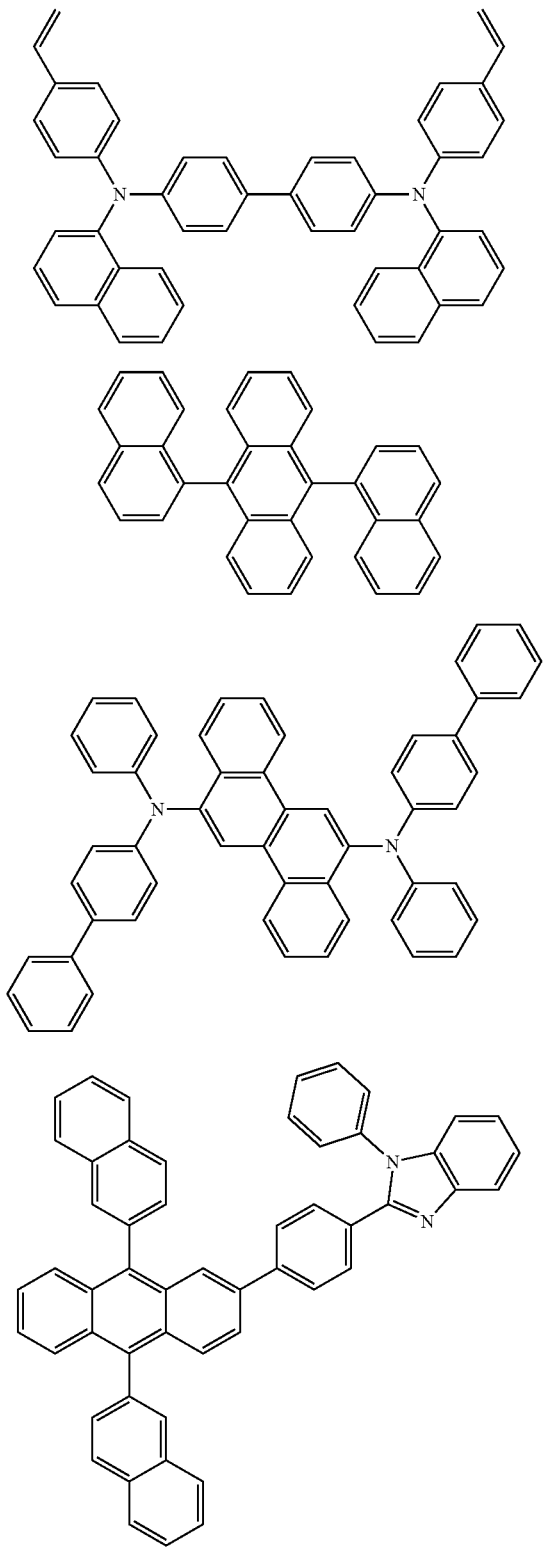

The P-doping material (Compound IB), Compound A and an organic solvent (cyclohexanone) were mixed to prepare Coating Composition Z. Compound A and the p-dopant (Compound IB) were mixed in a weight ratio of 8:2. A glass substrate on which indium tin oxide (ITO) was coated as a thin film to a thickness of 1,500 Å was placed in detergent-dissolved distilled water and ultrasonic cleaned for 30 minutes. After that, ultrasonic cleaning was repeated twice using distilled water for 10 minutes. After the cleaning with distilled water was finished, the substrate was ultrasonic cleaned with solvents of isopropyl alcohol and acetone for 30 minutes each, then dried, and then transferred to a glove box.

On the transparent ITO electrode prepared as above, Coating Composition Z was spin coated to form a hole injection layer having a thickness of 300 Å, and the coating composition was cured for 30 minutes at 220° C. on a hot plate under the nitrogen atmosphere. On the hole injection layer, a composition dissolving Compound A in an organic solvent (toluene) in a weight ratio of 1% was spin coated to form a hole transfer layer having a thickness of 400 Å. After that, the coating composition was cured for 30 minutes at 230° C. on a hot plate under the nitrogen atmosphere. On the hole transfer layer, a composition dissolving Compound B and Compound BD12 (8% concentration) in an organic solvent (toluene) in a weight ratio of 0.6% was spin coated to form a light emitting layer having a thickness of 200 Å, and the coating composition was cured for 10 minutes at 120° C. on a hot plate under the nitrogen atmosphere.

After that, the result was moved to a vacuum depositor, and Compound D (electron transfer layer, thickness: 200 Å), LiF (cathode, thickness: 12 Å) and aluminum (Al) (cathode, thickness: 2,000 Å) were consecutively deposited to manufacture an organic light emitting device. In the above-mentioned process, the deposition rates of the organic materials were maintained at 0.4 Å/sec to 0.7 Å/sec, the deposition rates of the LiF and the aluminum of the cathode were maintained at 0.3 Å/sec and 2 Å/sec, respectively, and the degree of vacuum during the deposition was maintained at $2 \times 10^{-7}$ torr to $5 \times 10^{-8}$ torr.

Example 2

An organic light emitting device was manufactured in the same manner as in Example 1 except that Compound BD24 was used instead of Compound BD12.

Example 3

An organic light emitting device was manufactured in the same manner as in Example 1 except that Compound BD30 was used instead of Compound BD12.

Example 4

An organic light emitting device was manufactured in the same manner as in Example 1 except that Compound BD38 was used instead of Compound BD12.

Comparative Example 1

An organic light emitting device was manufactured in the same manner as in Example 1 except that Compound C was used instead of Compound BD12.

For the organic light emitting devices manufactured in Example 1 to Example 4 and Comparative Example 1, results of measuring driving voltage and efficiency at current density of 10 mA/cm² are shown in the following Table 1.

In addition, Compound BD12, Compound BD24, Compound BD30, Compound BD38 and Compound C used in Example 1 to Example 4 and Comparative Example 1 were each introduced to a solvent (toluene 100 ml), and then left unattended for 30 minutes at room temperature (25° C.). After that, laser was passed through the solution to determine whether precipitates were formed through a tyndall effect, and the dissolved amount was measured. The process was repeated, and the results are shown in the following Table 1.

TABLE 1

| Example | Light Emitting Dopant | Solubility (wt %) | Driving Voltage (V) | Light Emission Wavelength (nm) | Current Efficiency (cd/A) | Power Efficiency (lm/W) |
|---|---|---|---|---|---|---|
| Example 1 | BD12 | 10 | 4.37 | 450 | 4.21 | 2.75 |
| Example 2 | BD24 | 10 | 5.5 | 442 | 4.46 | 2.86 |
| Example 3 | BD30 | 15 | 4.26 | 451 | 4.24 | 2.77 |
| Example 4 | BD38 | 15 | 5.43 | 443 | 4.56 | 2.89 |
| Comparative Example 1 | Compound C | 0.1 | 6.23 | 450 | 3.09 | 1.45 |

As seen from Table 1, it was identified that the organic light emitting devices of Example 1 to Example 4 using the compound represented by Chemical Formula 1 of the present specification exhibited properties of low voltage and high efficiency compared to Comparative Example 1, and was usable in an organic light emitting device.

Specifically, it was seen that, when using the compound represented by Chemical Formula 1 of the present specification as a dopant of a light emitting layer, solubility was enhanced and the light emission wavelength was closer to deep blue compared to Comparative Example 1. In addition, due to such enhanced solubility, it was seen that a driving voltage decreased and power efficiency increased when manufacturing a device using a solution process and evaluating device performance.

Hereinbefore, preferred embodiments of the present specification have been described, however, the present disclosure is not limited thereto, and various modifications may be implemented in the scope of the claims and the scope of the detailed descriptions of the disclosure, and these also fall within the category of the present disclosure.

REFERENCE NUMERAL

101: Substrate
201: Anode
301: Hole Injection Layer
401: Hole Transfer Layer
501: Light Emitting Layer
601: Electron Transfer Layer
701: Cathode

The invention claimed is:

1. A coating composition comprising a solvent and a compound represented by the following Chemical Formula 1:

[Chemical Formula 1]

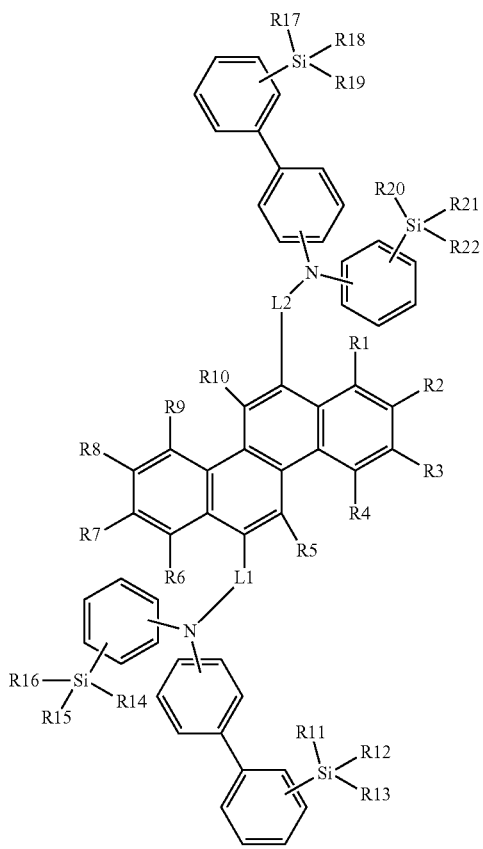

wherein, in Chemical Formula 1,

L1 and L2 are the same as or different from each other, and each independently a direct bond; a substituted or unsubstituted arylene group; or a substituted or unsubstituted heteroarylene group;

R1 to R10 are the same as or different from each other, and each independently hydrogen; deuterium; a halogen group; a hydroxyl group; a nitrile group; a substituted or unsubstituted alkyl group; a substituted or unsubstituted cycloalkyl group; a substituted or unsubstituted silyl group; a substituted or unsubstituted aryl group; or a substituted or unsubstituted heterocyclic group; and R11 to R22 are the same as or different from each other, and each independently a substituted or unsubstituted aryl group, wherein a concentration of the compound dissolved in the solvent is 0.5 wt/v % to 20 wt/v %.

2. The coating composition of claim 1, wherein R11 to R22 are the same as or different from each other, and each independently a substituted or unsubstituted phenyl group, a substituted or unsubstituted biphenyl group, or a substituted or unsubstituted naphthyl group.

3. The coating composition of claim 1, wherein Chemical Formula 1 is any one selected from among the following compounds:

BD1

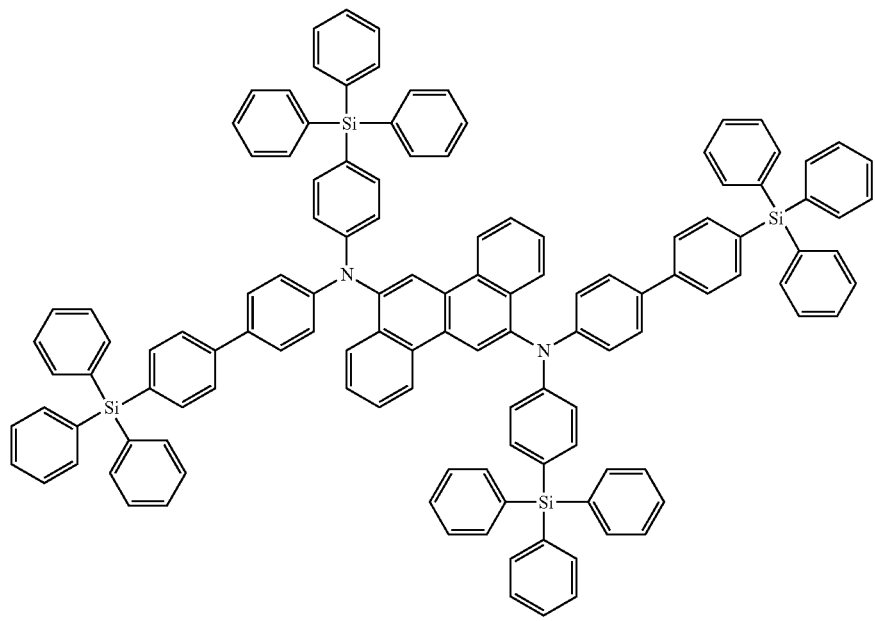

BD2

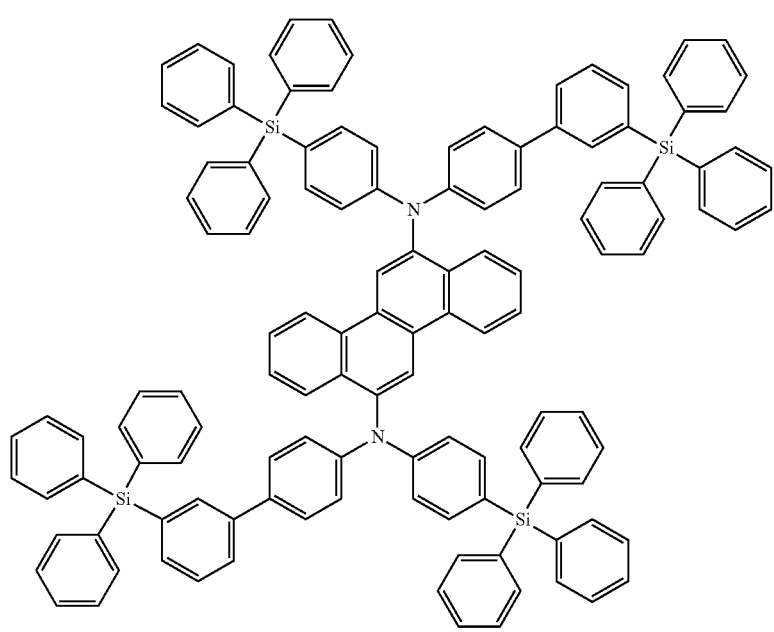

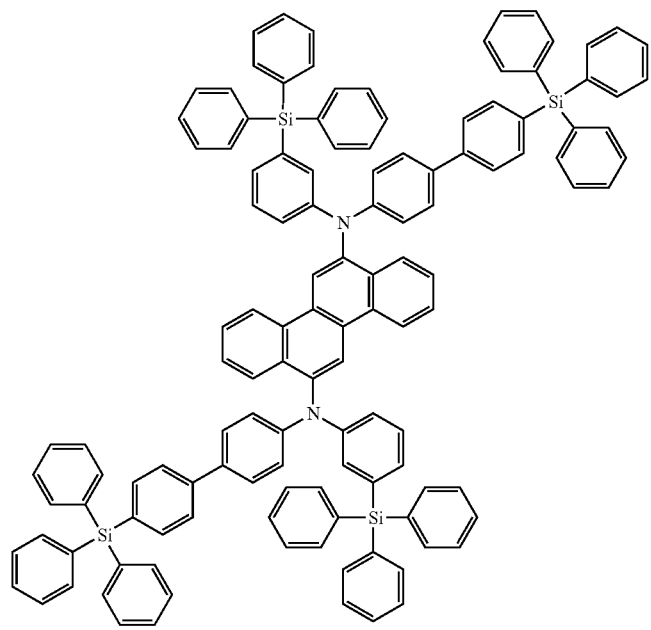
BD3
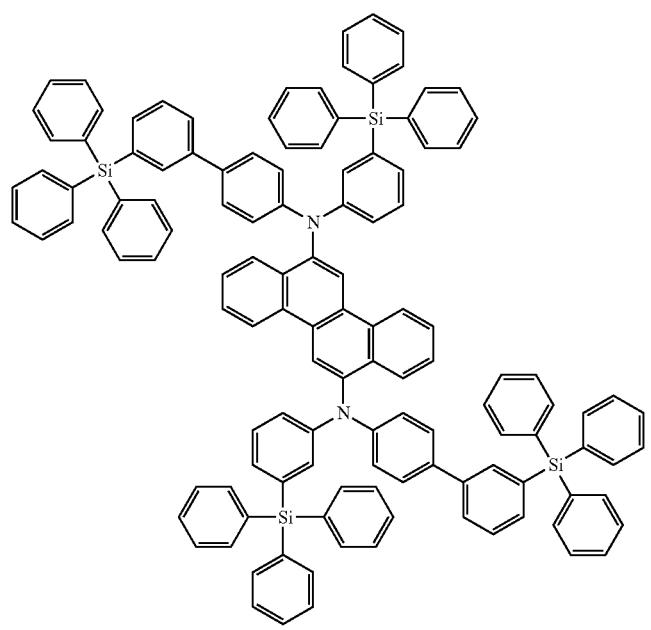
BD4

BD5
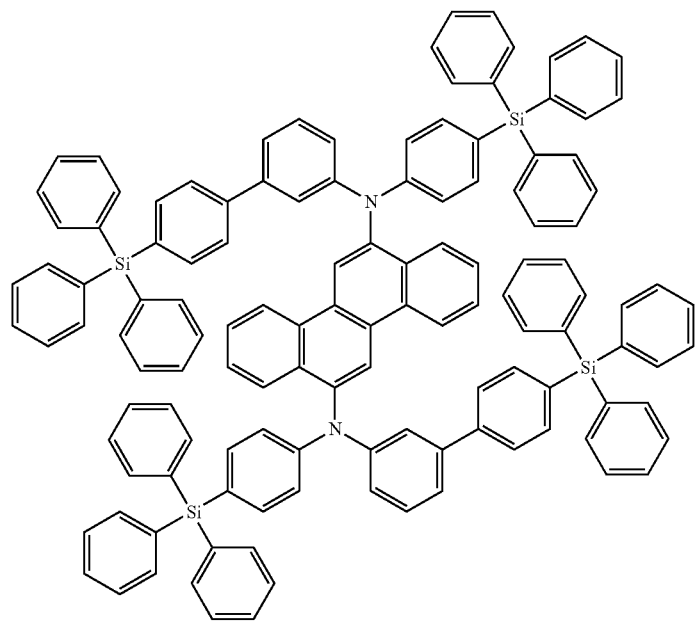
BD6
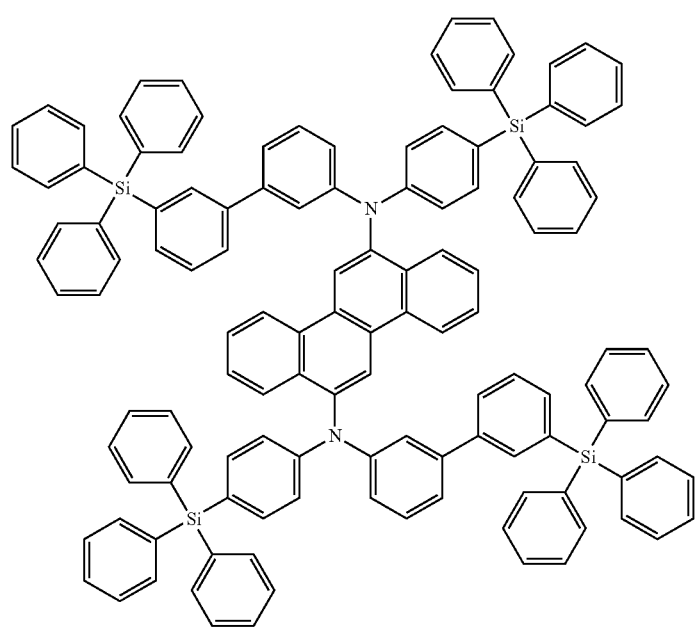

-continued
BD7
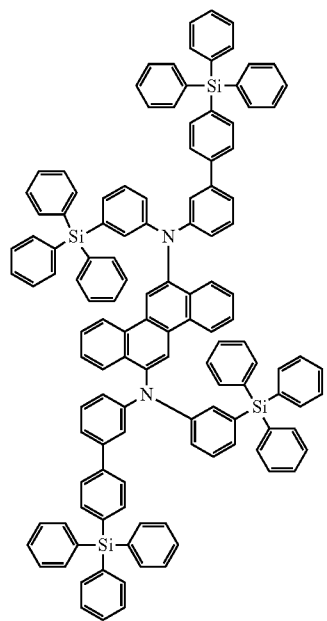
BD8
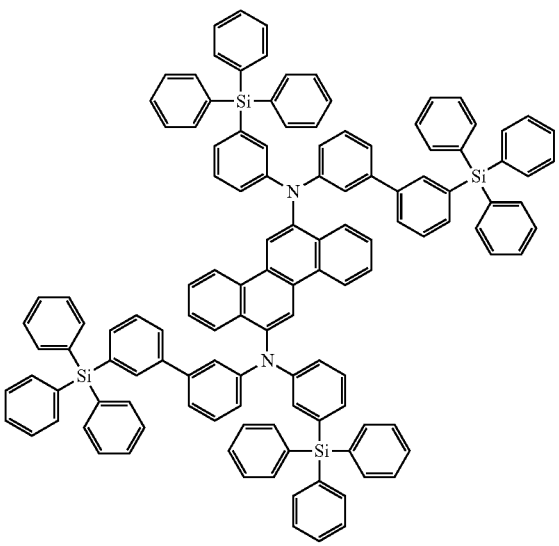
BD9
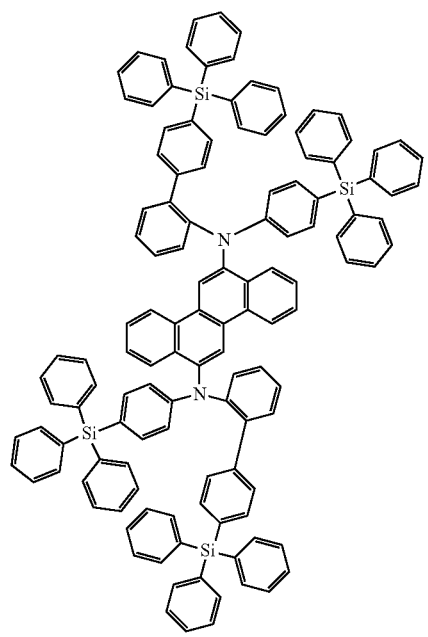
BD10
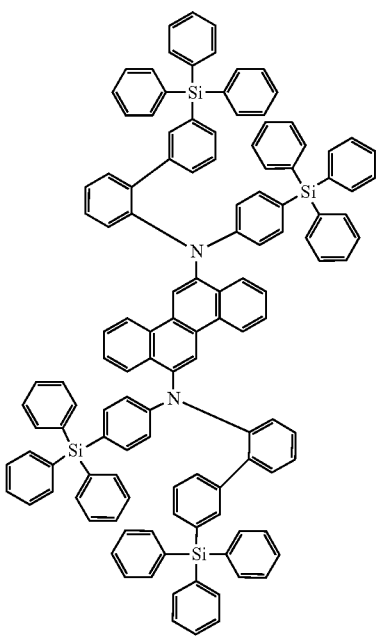

-continued
BD11
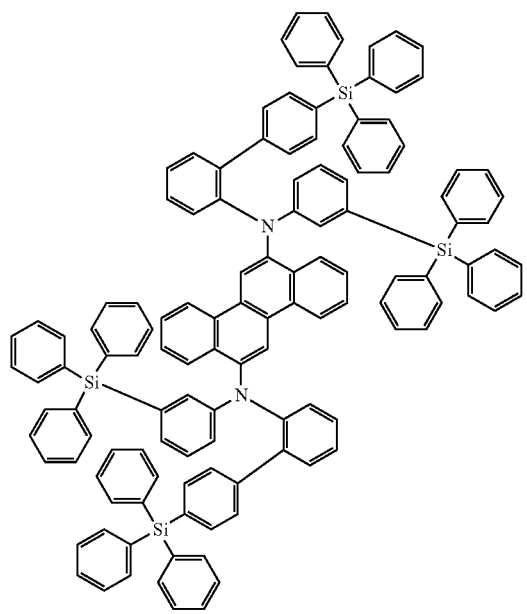
BD12
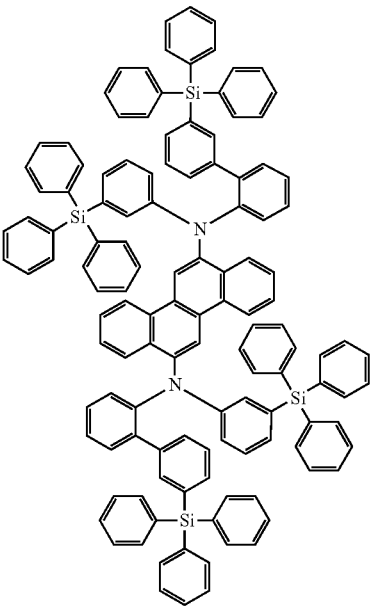
BD13
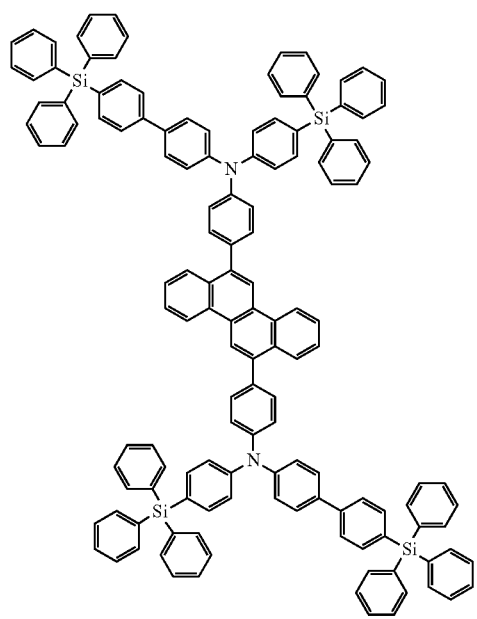
BD14
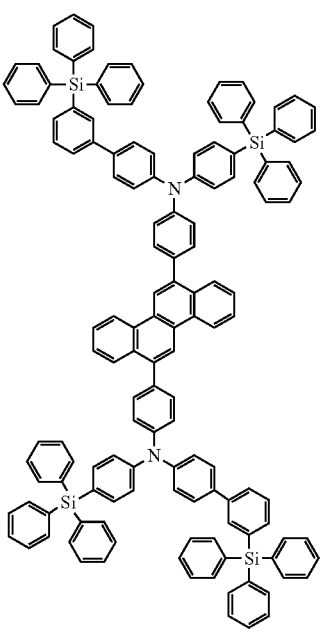

-continued
BD15
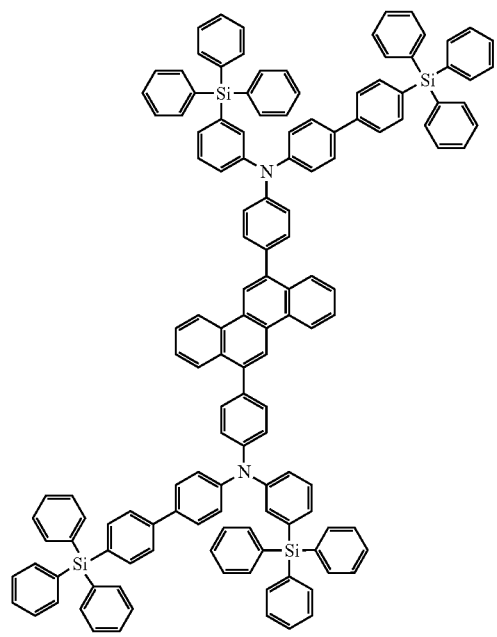
BD16
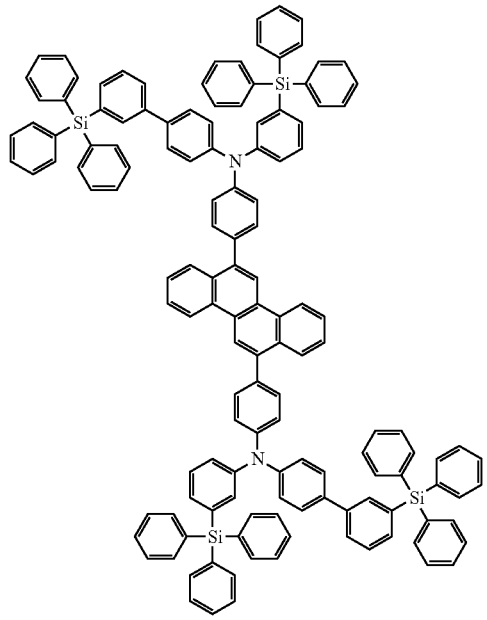
BD17
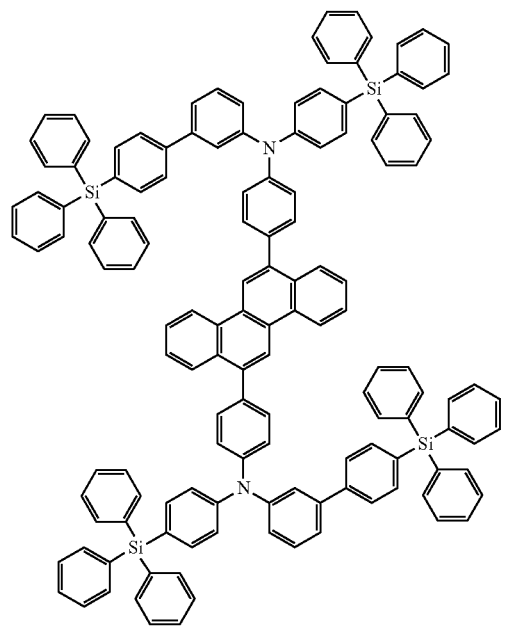
BD18
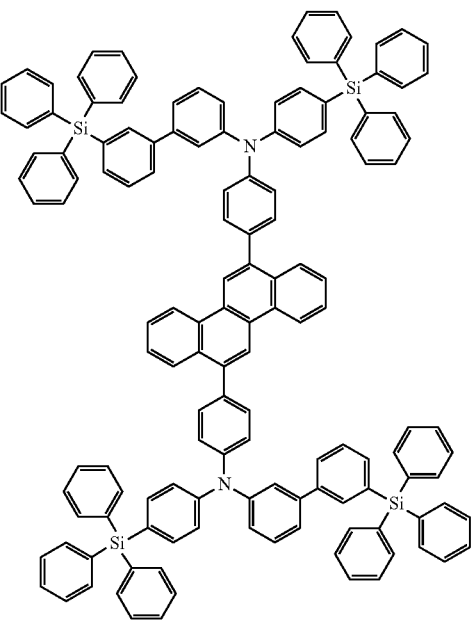

-continued
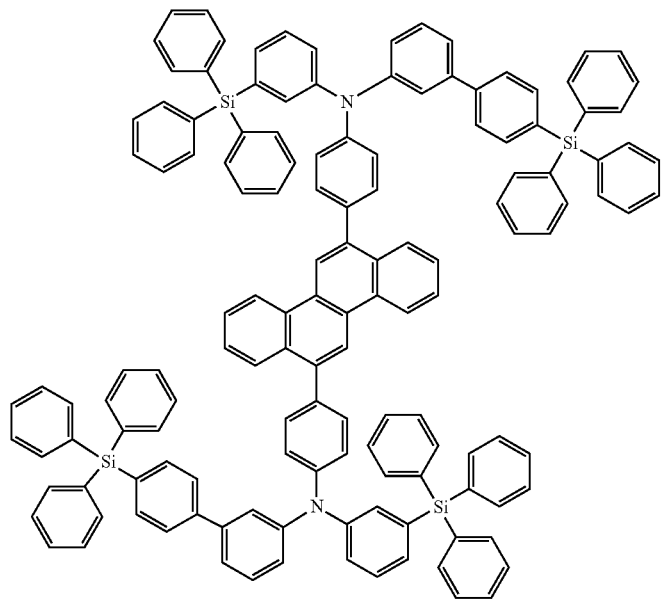
BD19
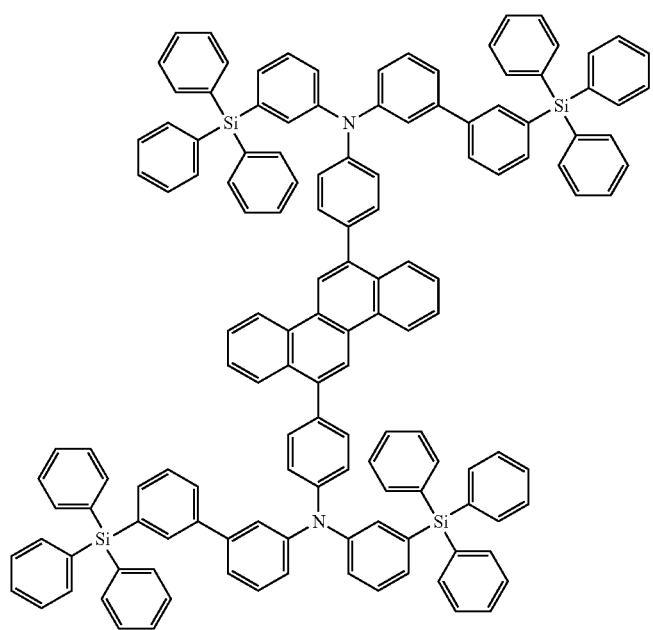
BD20

-continued
BD21
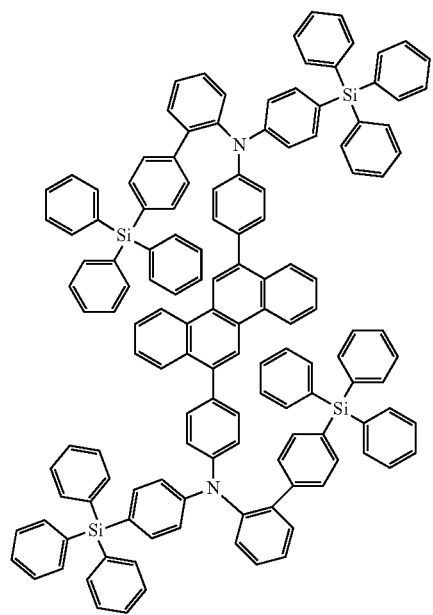
BD22
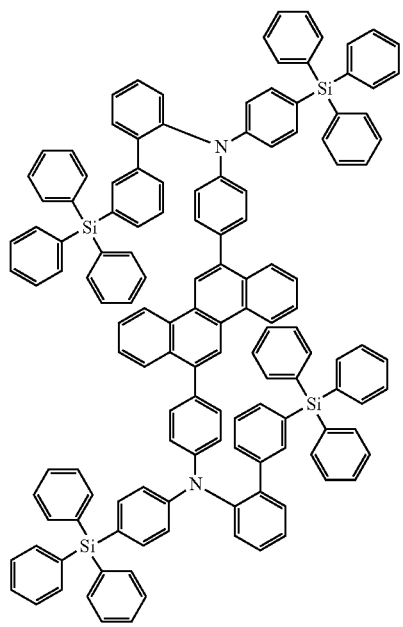
BD23
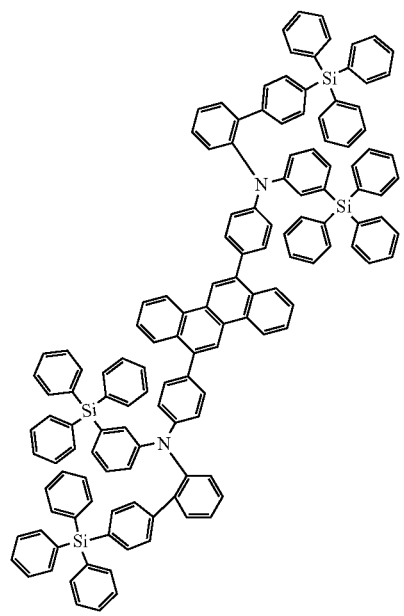
BD24
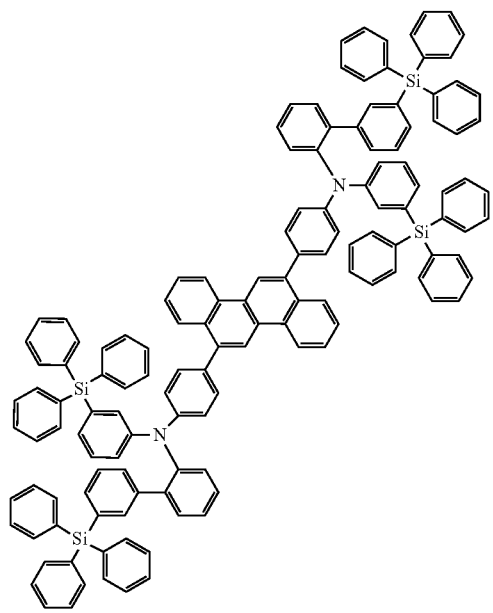

-continued
BD25
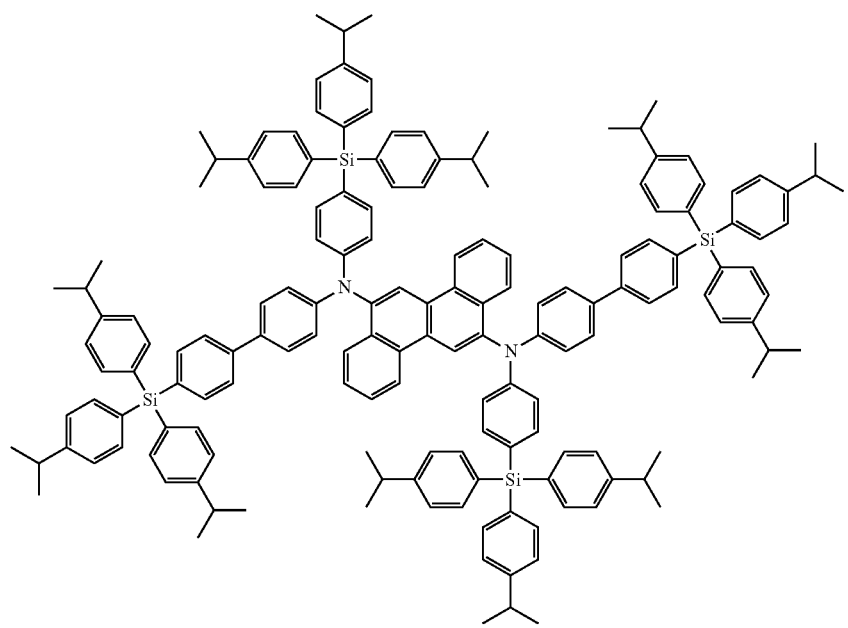
BD26
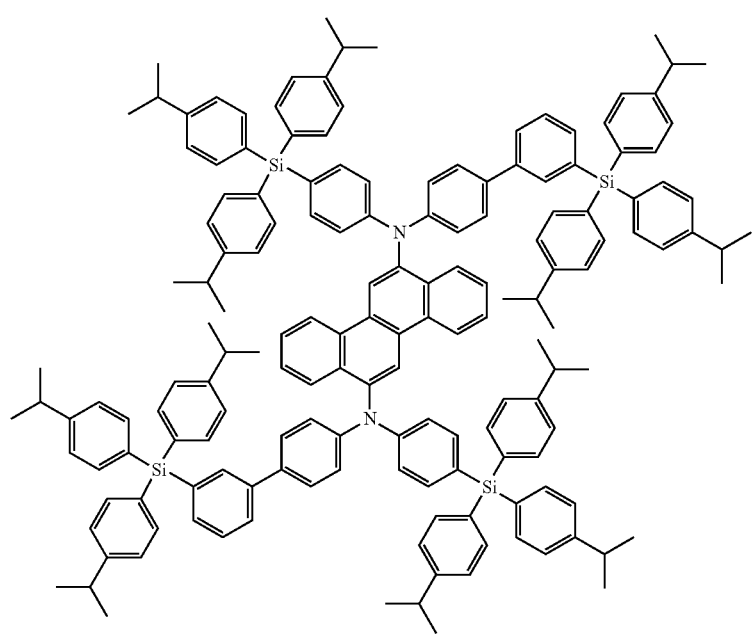

-continued
BD27
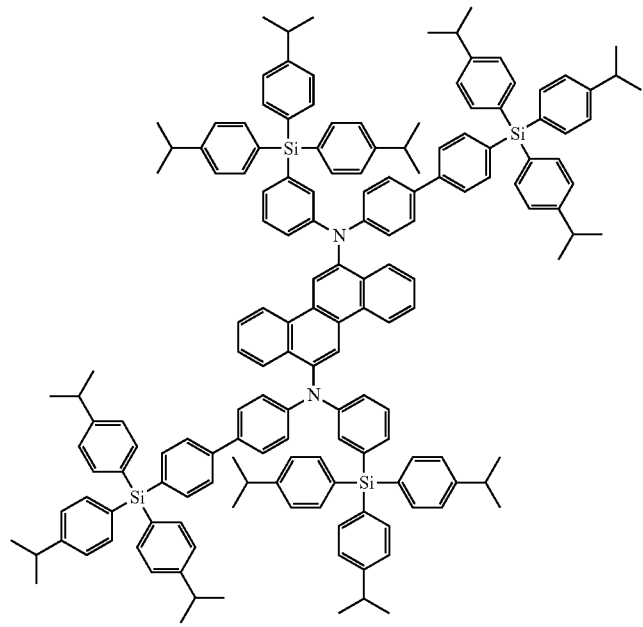
BD28
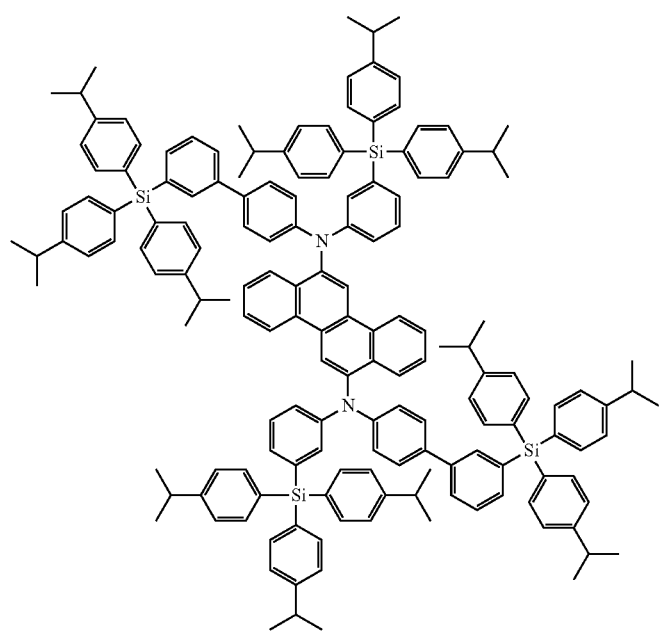

-continued
BD29
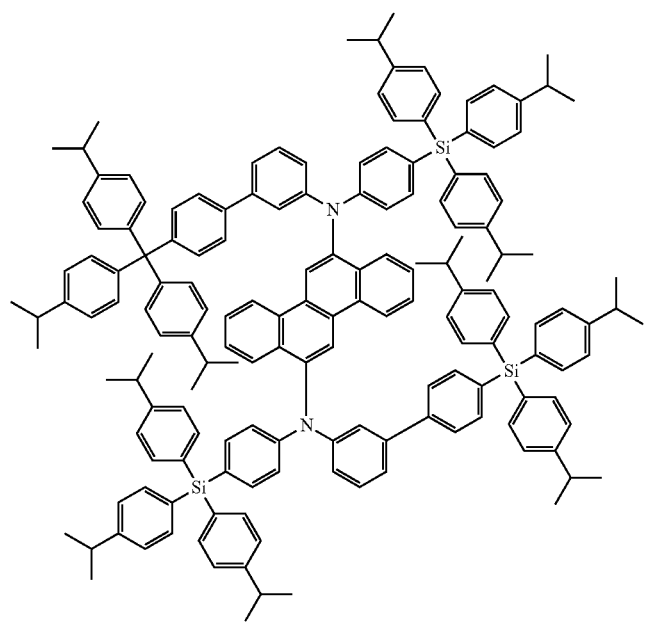
BD30
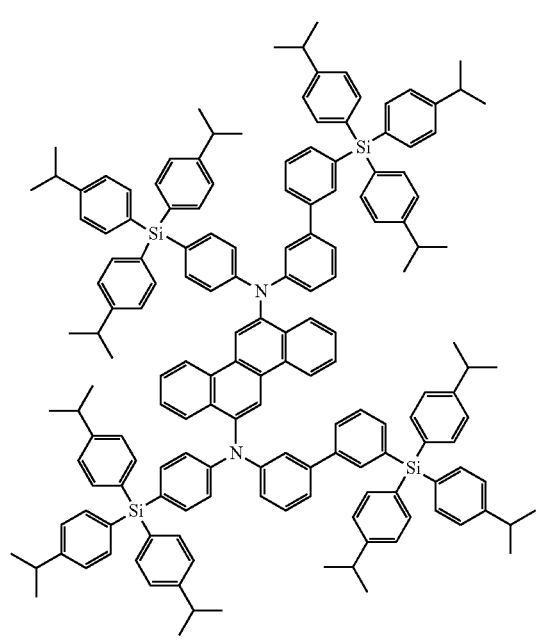

BD31
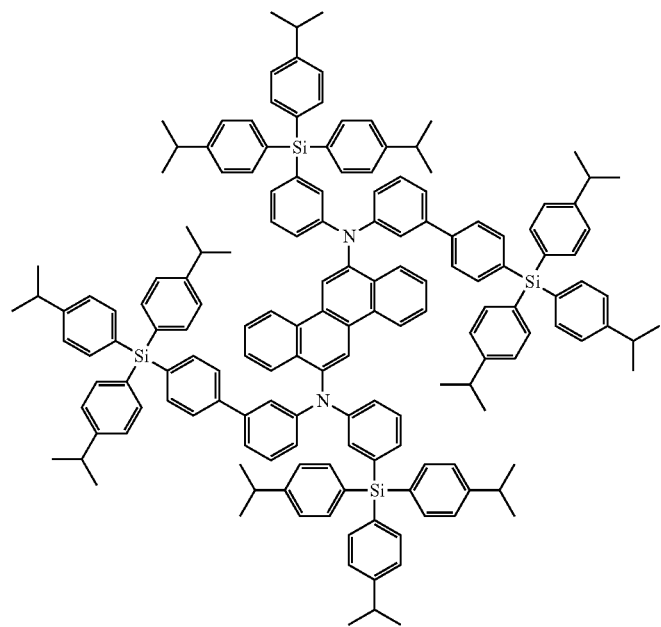
BD32
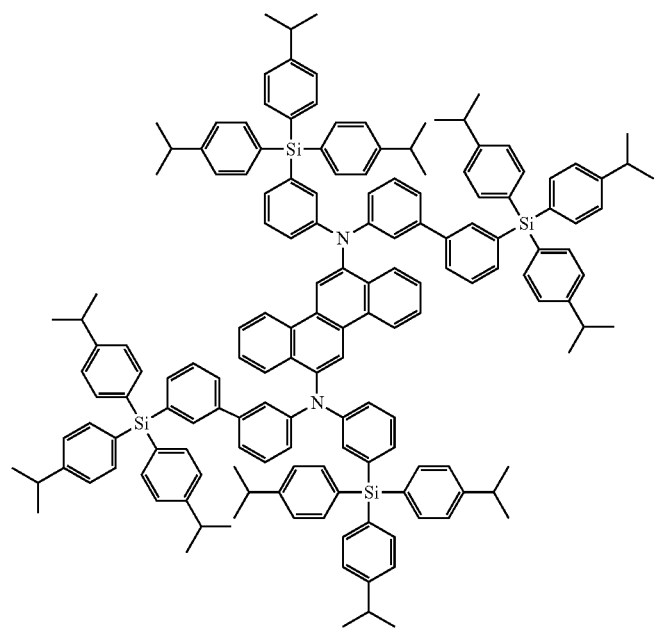

-continued
BD33
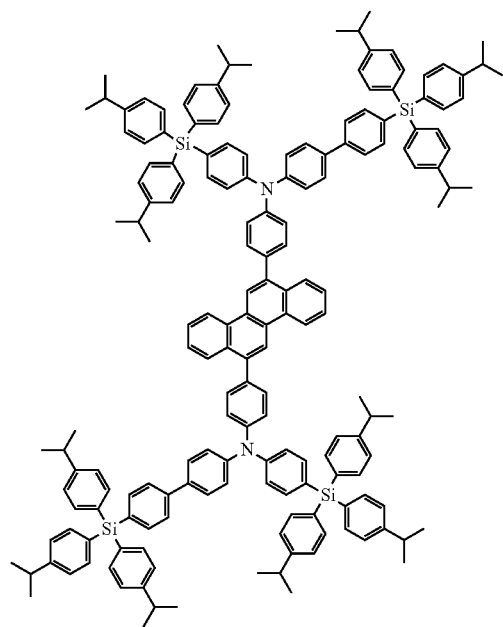
BD34
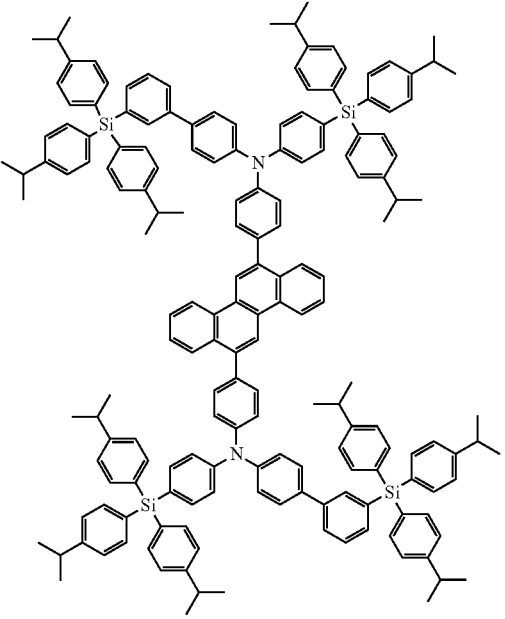
BD35
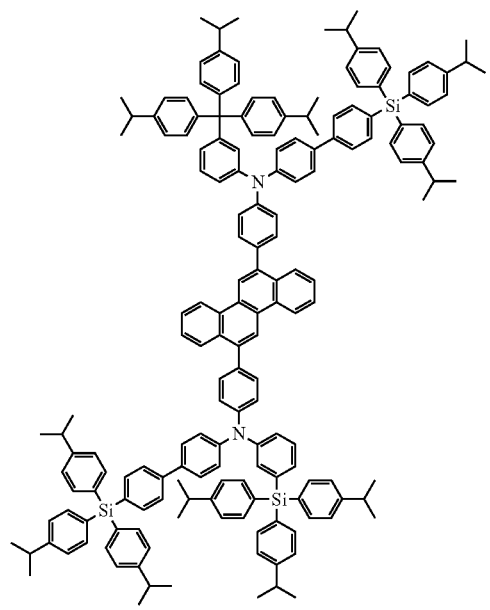
BD36
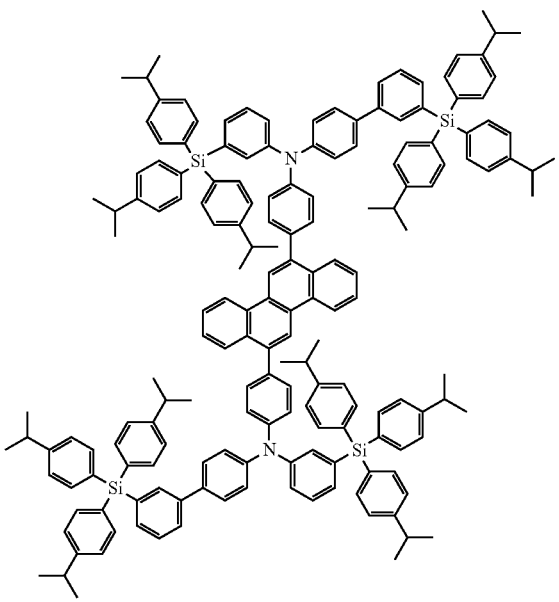

BD37
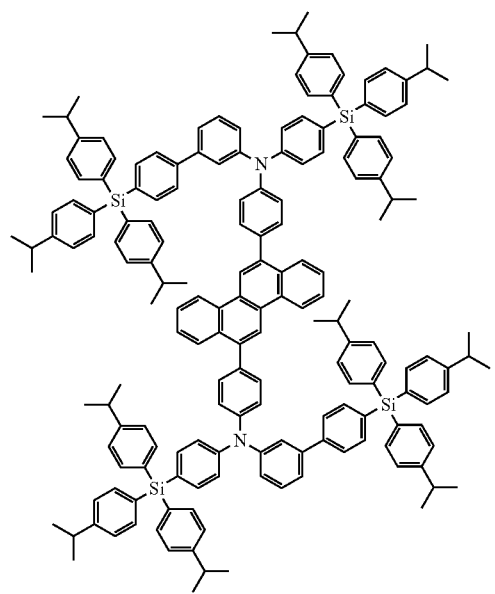
BD38
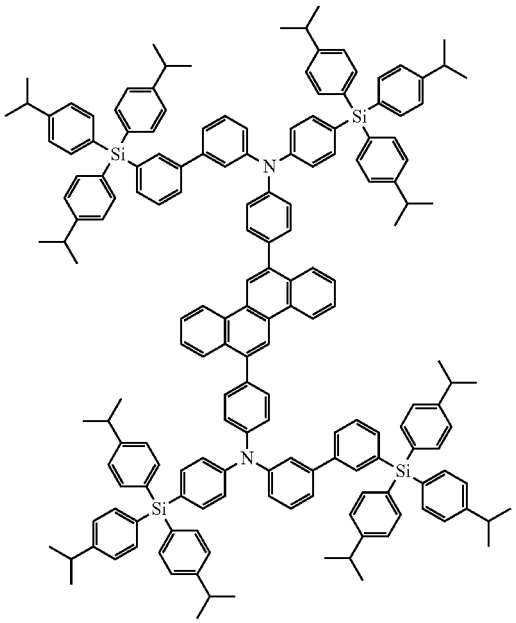
BD39
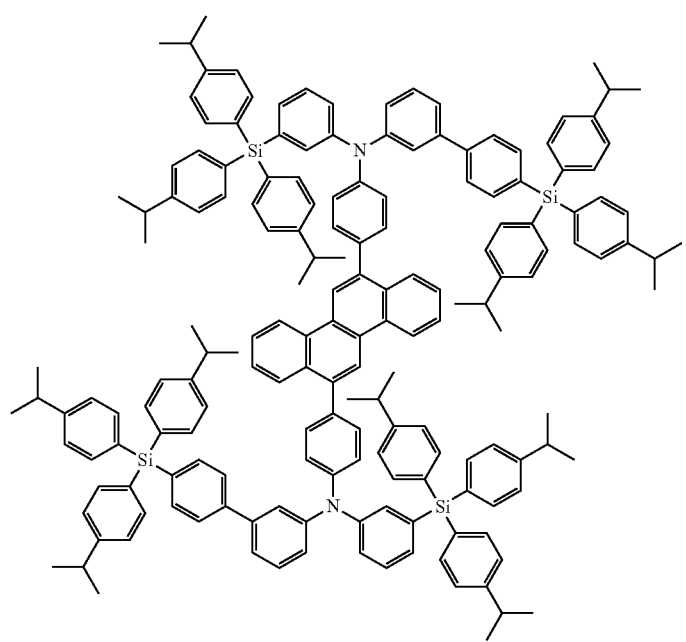

BD40

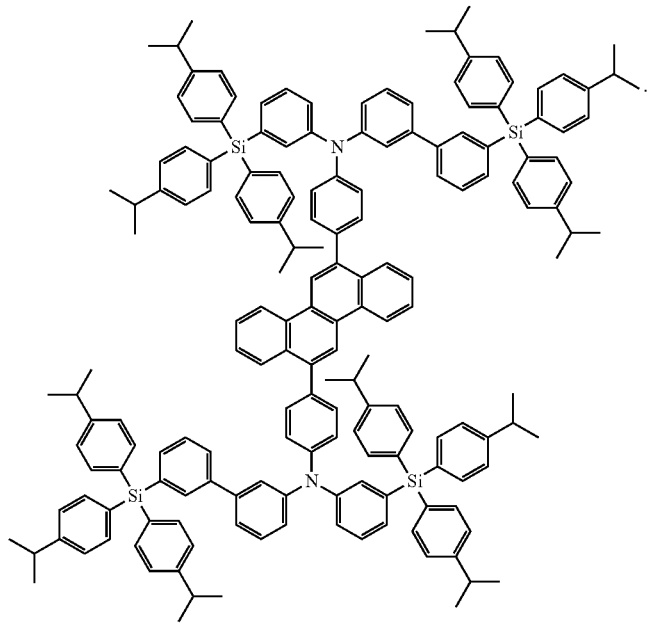

4. The coating composition of claim 1, wherein L1 and L2 are the same as or different from each other, and each independently a direct bond; or a phenylene group.

5. The coating composition of claim 1, wherein R1 to R10 are each hydrogen.

6. The coating composition of claim 1, wherein R11 to R22 are each a phenyl group.

7. The coating composition of claim 1, wherein the solvent is an aromatic hydrocarbon-based solvent, an aliphatic hydrocarbon-based solvent, an ester-based solvent, polyalcohol and derivatives thereof, a sulfoxide-based solvent, an amide-based solvent, a benzoate-based solvent, or tetraline.

8. A method for manufacturing an organic light emitting device comprising:
   preparing a substrate;
   forming a first electrode on the substrate;
   forming one or more organic material layers on the first electrode; and
   forming a second electrode on the organic material layer, wherein the forming of organic material layers comprises forming one or more organic material layers using the coating composition of claim 1.

9. The method for manufacturing an organic light emitting device of claim 8, wherein the forming of one or more organic material layers using the coating composition uses an inkjet coating method or a spin coating method.

10. The method for manufacturing an organic light emitting device of claim 8, wherein the forming of one or more organic material layers using the coating composition comprises coating the coating composition on the first electrode; and drying the coated coating composition.

* * * * *